US011917887B2

(12) United States Patent
Shi

(10) Patent No.: US 11,917,887 B2
(45) Date of Patent: Feb. 27, 2024

(54) DISPLAY SUBSTRATE INCLUDING TWO DISPLAY REGIONS WITH DIFFERENT LIGHT TRANSMITTANCE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventor: Bo Shi, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 183 days.

(21) Appl. No.: 17/482,447

(22) Filed: Sep. 23, 2021

(65) Prior Publication Data
US 2022/0238612 A1   Jul. 28, 2022

(30) Foreign Application Priority Data
Jan. 26, 2021   (CN) .......................... 202110102361.7

(51) Int. Cl.
*H10K 59/65*    (2023.01)
*H10K 59/121*   (2023.01)
*H10K 59/126*   (2023.01)
*G01S 17/08*    (2006.01)

(52) U.S. Cl.
CPC .......... *H10K 59/65* (2023.02); *H10K 59/121* (2023.02); *H10K 59/126* (2023.02); *G01S 17/08* (2013.01)

(58) Field of Classification Search
CPC .............................. H10K 59/65; H10K 59/00
See application file for complete search history.

(56) References Cited

U.S. PATENT DOCUMENTS

2019/0237521 A1   8/2019   Ju
2020/0410937 A1*  12/2020  Chen .................... G09G 3/3233
2021/0357672 A1   11/2021  Sun et al.

FOREIGN PATENT DOCUMENTS

| CN | 110033699 A | 7/2019 |
| CN | 111223912 A | 6/2020 |
| CN | 211319243 U | 8/2020 |

OTHER PUBLICATIONS

Office Action dated Aug. 3, 2022 for Chinese Patent Application No. 202110102361.7 and English Translation.

* cited by examiner

*Primary Examiner* — Suberr L Chi
(74) *Attorney, Agent, or Firm* — Ling Wu; Stephen Yang; Ling and Yang Intellectual Property

(57) ABSTRACT

Provided is a display substrate including a first display region and at least one second display region, wherein light transmittance of the second display region is greater than light transmittance of the first display region. The second display region of the display substrate is provided with a light adjustment layer configured to adjust a light transmission effect of the second display region.

19 Claims, 17 Drawing Sheets

DISPLAY SUBSTRATE INCLUDING TWO DISPLAY REGIONS WITH DIFFERENT LIGHT TRANSMITTANCE AND DISPLAY APPARATUS

CROSS-REFERENCE TO RELATED APPLICATION

The present application claims the priority of Chinese Patent Application No. 202110102361.7 filed to the CNIPA on Jan. 26, 2021, the content of which is incorporated herein by reference.

TECHNICAL FIELD

The present disclosure relates to, but is not limited to, the field of display technology, in particular to a display substrate and a display apparatus.

BACKGROUND

With the continuous development of display technology, full-screen display apparatuses have gradually gained their popularity among the population and have become mainstream display products. A full-screen display apparatus has a relatively high screen occupation (generally reaching 80% or even more than 90%), which achieves a larger display screen without increasing an overall size of the display apparatus.

SUMMARY

The following is a summary about the subject matter described in the present disclosure in detail. The brief description is not intended to limit the scope of protection of the claims.

An embodiment of the present disclosure provides a display substrate and a display apparatus.

In one aspect, an embodiment of the present disclosure provides a display substrate, including a first display region and at least one second display region, wherein light transmittance of the second display region is greater than light transmittance of the first display region. The second display region of the display substrate is provided with a light adjustment layer configured to adjust a light transmission effect of the second display region.

In some exemplary embodiments, the second display region includes a first sub-display region and a second sub-display region. When a TOF element including an emitting sensor and a receiving sensor is disposed at a side away from a light-emitting surface of the display substrate, an orthographic projection of the emitting sensor on the display substrate is located in the first sub-display region, and an orthographic projection of the receiving sensor on the display substrate is located in the second sub-display region. The light adjustment layer is disposed in the first sub-display region, and a surface of the light adjustment layer close to the light-emitting surface of the display substrate is convex.

In some exemplary embodiments, a first sub-display region of the display substrate includes a base substrate and a light-emitting element disposed on the base substrate, and the light adjustment layer is located on a side of the light-emitting element close to the base substrate.

In some exemplary embodiments, the light-emitting element includes a first electrode, a second electrode and an organic functional layer disposed between the first electrode and the second electrode, and the first electrode is located on a side of the second electrode close to the base substrate. An orthographic projection of the first electrode on the base substrate includes an orthographic projection of the light adjustment layer on the base substrate.

In some exemplary embodiments, the light adjustment layer includes a first adjustment layer and a light reflection layer sequentially disposed on the base substrate; and an orthographic projection of the light reflection layer on the base substrate includes an orthographic projection of the first adjustment layer on the base substrate.

In some exemplary embodiments, the first adjustment layer includes a plurality of first adjustment blocks; the light reflection layer includes a plurality of light reflection blocks which are in one-to-one correspondence with the plurality of first adjustment blocks. In a plane perpendicular to the display substrate, a cross section of the first adjustment block has a shape in which a first length is gradually reduced in a direction away from a surface of the base substrate, and the first length is a length of the first adjustment block in a direction parallel to the surface of the base substrate.

In some exemplary embodiments, in the plane perpendicular to the display substrate, the cross section of the first adjustment block is about a triangle or a semicircle.

In some exemplary embodiments, a material of the first adjustment layer is an organic material.

In some exemplary embodiments, the first display region of the display substrate includes a base substrate, and a light shielding layer, a drive structure layer and a light-emitting element which are sequentially disposed on the base substrate; and the light reflection layer and the light shielding layer are disposed at a same layer.

In some exemplary embodiments, the display substrate further includes a base substrate and a plurality of pixel units disposed on the base substrate; at least one pixel unit includes a plurality of sub-pixels, and at least one sub-pixel includes a light-emitting element and a pixel drive circuit for driving the light-emitting element to emit light; the light-emitting element includes a first electrode, a second electrode and an organic functional layer disposed between the first electrode and the second electrode, wherein the first electrode is located on a side of the second electrode close to the base substrate. The light adjustment layer includes a second adjustment layer, which is located on a side of the second electrode away from the light-emitting surface of the display substrate.

In some exemplary embodiments, the second adjustment layer includes a plurality of second adjustment blocks; an orthographic projection of at least one second adjustment block on the base substrate is located between orthographic projections of first electrodes of adjacent pixel units on the base substrate, and an area of the orthographic projection of the at least one second adjustment block between the first electrodes of adjacent pixel units is about half of an area of an orthographic projection of a second electrode between the first electrodes of the adjacent pixel units.

In some exemplary embodiments, there is an orthographic projection of a second adjustment block on the base substrate between the orthographic projections of the first electrodes of the adjacent pixel units on the base substrate, and the orthographic projection of the second adjustment block on the base substrate is located in the middle of the first electrodes of the adjacent pixel units or close to a first electrode of one of the adjacent pixel units; or, there are orthographic projections of two second adjustment blocks on the base substrate between the orthographic projections of the first electrodes of the adjacent pixel units on the base substrate, and the orthographic projections of the two second adjustment blocks on the base substrate are respectively adjacent to a first electrode of one of the adjacent pixel units.

In some exemplary embodiments, a material of the second adjustment layer is an inorganic material, and a thickness of the second adjustment layer is about 1.8 microns to 3.8 microns.

In some exemplary embodiments, the first display region includes a base substrate, a display structure layer and a light-emitting element sequentially disposed on the base substrate; the second display region includes a base substrate and a light-emitting element disposed on the base substrate. The light-emitting element includes a first electrode, a second electrode and an organic functional layer disposed between the first electrode and the second electrode, and the first electrode is located on a side of the second electrode close to the base substrate. The light adjustment layer is located on a side of the first electrode close to the base substrate, and the first electrode is electrically connected with the display structure layer of the first display region through the light adjustment layer.

In some exemplary embodiments, the light adjustment layer includes at least one transparent wiring layer including a plurality of transparent wirings extending in a same direction; and at least one transparent wiring has a wave shape.

In some exemplary embodiments, the light adjustment layer includes a first transparent wiring layer and a second transparent wiring layer which are stacked; the first transparent wiring layer includes a plurality of first transparent wirings, and the second transparent wiring layer includes a plurality of second transparent wirings, and the first transparent wirings and the second transparent wirings extend in a same direction. Orthographic projections of the plurality of first transparent wirings of the first transparent wiring layer on the base substrate are staggered with orthographic projection of the plurality of second transparent wirings of the second transparent wiring layer on the base substrate.

In some exemplary embodiments, the light adjustment layer includes at least one transparent wiring layer and a third adjustment layer; the at least one transparent wiring layer includes a plurality of transparent wirings extending in a same direction, and the third adjustment layer fills gaps of the plurality of transparent wirings.

In some exemplary embodiments, a thickness of the third adjustment layer is about 1.3 microns to 1.7 microns.

In another aspect, an embodiment of the present disclosure provides a display apparatus, which includes any one of the aforementioned display substrates and an optical device located at a side away from a light-emitting surface of the display substrate; wherein, an orthographic projection of the optical device on the display substrate overlaps with the second display region.

Other aspects may be comprehended upon reading and understanding of the drawings and the detailed descriptions.

BRIEF DESCRIPTION OF DRAWINGS

The accompanying drawings are used to provide a further understanding of the technical solution of the present disclosure, constitute a part of the description, and are used to explain the technical solution of the present disclosure together with the embodiments of the present disclosure, without forming a limitation to the technical solution of the present disclosure. Shapes and sizes of one or more components in the accompanying drawings do not reflect real scales, and are only for a purpose of schematically illustrating contents of the present disclosure.

DETAILED DESCRIPTION

Figure 1:
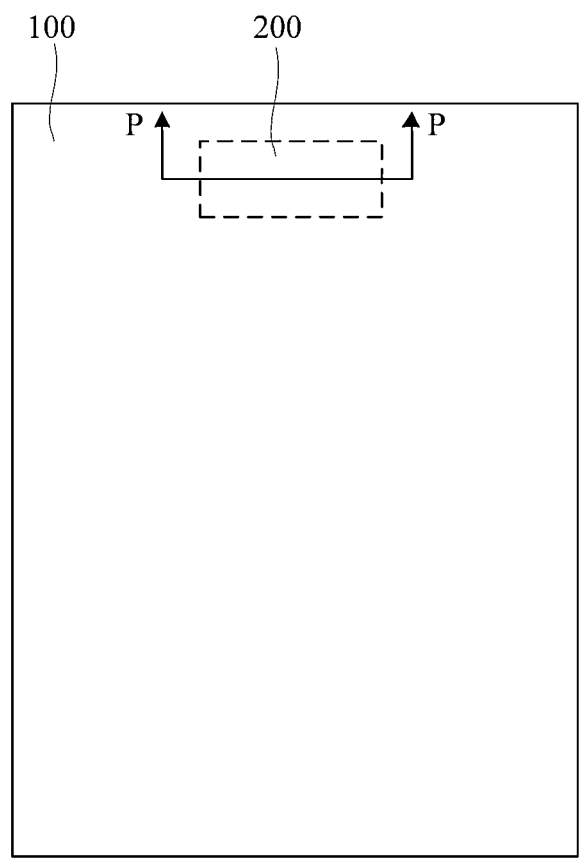
FIG. 1 is a schematic plan view of a display region of a display substrate according to at least one embodiment of the present disclosure.

Hereinafter embodiments of the present disclosure will be described in detail with reference to the accompanying drawings. The embodiments may be implemented in a number of different forms. Those of ordinary skills in the art will readily understand the fact that implementations and contents may be transformed into one or more of forms without departing from the spirit and scope of the present disclosure. Therefore, the present disclosure should not be interpreted as being limited to the content described in the following embodiments. In the case of no conflict, the embodiments in the present disclosure and the features in the embodiments can be randomly combined with each other.

In the drawings, size of one or more constituent elements, or thickness or region of a layer, is sometimes exaggerated for clarity. Therefore, an implementation of the present disclosure is not necessarily limited to the size shown, and a shape and size of each component in the drawings do not reflect true proportions. In addition, the drawings schematically illustrate ideal examples, and any embodiment of the present disclosure is not limited to the shapes, numerical values or the like illustrated in the drawings.

The "first", "second", "third" and other ordinal numbers in the present disclosure are used to avoid confusion of constituent elements, not to provide any quantitative limitation. In the description of the present disclosure, "a plurality of" means two or more counts.

In the present disclosure, for the sake of convenience, wordings such as "central", "upper", "lower", "front", "rear", "vertical", "horizontal", "top", "bottom", "inner", "outer" and the others describing the orientations or positional relations are used to depict positional relations of elements with reference to the drawings, which are only convenient for describing the specification and simplifying description, rather than for indicating or implying that the apparatus or element referred to must have a specific orientation, or must be constructed and operated in a particular orientation, and therefore, those wordings cannot be construed as limitations on the present disclosure. The positional relations of the constituent elements may be appropriately changed according to the direction in which constituent elements are described. Therefore, the wordings described herein are not restrictive, and may be appropriately replaced according to the situation.

In the present disclosure, the terms "installed", "connected" and "coupled" shall be understood in their broadest sense unless otherwise explicitly specified and defined. For example, a connection may be a fixed connection, a detachable connection, or an integrated connection, may be a mechanical connection or an electrical connection, or may be a direct connection, an indirect connection through a middleware, or internal communication between two components. Those of ordinary skill in the art may understand the meanings of the terms in the present disclosure according to specific situations. Wherein, "electric connection" includes connection of the composition elements through an element with a certain electric action. The "element having a certain electrical function" is not particularly limited as long as it can send and receive an electrical signal between the connected constituent components. Examples of the "element having a certain electrical action" not only include electrodes and wirings, but also include switch elements (such as transistors), resistors, inductors, capacitors, and other elements with one or more functions.

In the present disclosure, a transistor refers to an element including at least three terminals, namely, a gate electrode, a drain electrode and a source electrode. The transistor has a channel region between the drain electrode (drain electrode terminal, drain region, or drain electrode) and the source electrode (source electrode terminal, source region, or source electrode), and a current can flow through the drain electrode, the channel region, and the source electrode. In the present disclosure, the channel region refers to a region through which the current mainly flows.

In the present disclosure, to distinguish two electrodes of the transistor except a gate, one of the electrodes is referred to as a first electrode and the other electrode is referred to as a second electrode. The first electrode may be a source electrode or a drain electrode, and the second electrode may be a drain electrode or a source electrode. In addition, the gate of the transistor is referred to as a control electrode. In a case of using transistors with opposite polarities or in a case where the direction of the current in circuit operation changes, functions of the "source electrode" and the "drain electrode" may be interchanged sometimes. Therefore, in the present disclosure, "the source electrode" and "the drain electrode" are interchangeable.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, "conductive layer" may be replaced with "conductive film" sometimes. Similarly, "insulating film" may be replaced with "insulating layer" sometimes.

In this disclosure, "thickness" refers to a vertical distance between a surface of the film layer away from a base substrate and a surface of the film layer close to the base substrate.

In this specification, "about" refers to a numerical value within a range of allowable process and measurement errors without strictly limiting a limit.

An embodiment of the present disclosure provides a display substrate, which includes a first display region and at least one second display region, wherein light transmittance of the second display region is greater than light transmittance of the first display region. The second display region of the display substrate is provided with a light adjustment layer configured to adjust a light transmission effect of the second display region.

According to the display substrate provided in this embodiment, the light adjustment layer is disposed in the second display region to improve the light transmission effect inside the display substrate, for example to change a reflection direction of infrared or improving the glare of the display substrate, thereby improving the service performance of an optical device disposed at a side away from a light-emitting surface of the display substrate.

In some exemplary embodiments, the second display region includes a first sub-display region and a second sub-display region. When a TOF element including an emitting sensor and a receiving sensor is disposed at the side away from the light-emitting surface of the display substrate, an orthographic projection of the emitting sensor on the display substrate is located in the first sub-display region, and an orthographic projection of the receiving sensor on the display substrate is located in the second sub-display region. The light adjustment layer is disposed in the first sub-display region, and the surface of the light adjustment layer close to the light-emitting surface of the display substrate is convex. In this exemplary embodiment, the surface of the light adjustment layer located in the first sub-display region close to the light-emitting surface of the display substrate is set to be a convex surface, a reflection direction of infrared emitted by the emitting sensor of the TOF element inside the display substrate may be changed, thereby reducing interference infrared entering the receiving sensor.

In some exemplary embodiments, the first sub-display region of the display substrate includes a base substrate and a light-emitting element disposed on the base substrate, and the light adjustment layer is located on a side of the light-emitting element close to the base substrate.

In some exemplary embodiments, a light-emitting element includes a first electrode, a second electrode and an organic functional layer disposed between the first electrode and the second electrode, wherein the first electrode is located on a side of the second electrode close to the base substrate. An orthographic projection of the first electrode on the base substrate includes an orthographic projection of the light adjustment layer on the base substrate. In some examples, the first electrode is an anode and the second electrode is a cathode.

In some exemplary embodiments, a light adjustment layer includes a first adjustment layer and a light reflection layer sequentially disposed on the base substrate. An orthographic projection of the light reflection layer on the base substrate includes an orthographic projection of the first adjustment layer on the base substrate. In this exemplary embodiment, the surface of the light reflection layer close to the light-emitting surface side of the display substrate is adjusted by the first adjustment layer, and the reflection direction of infrared inside the display substrate may be changed by the light reflection layer.

In some exemplary embodiments, the first adjustment layer includes a plurality of first adjustment blocks, and the light reflection layer includes a plurality of light reflection blocks which are in one-to-one correspondence with a plurality of first adjustment blocks. In a plane perpendicular to the display substrate, a cross section of the first adjustment block has a shape in which a first length is gradually reduced in a direction away from a surface of the base substrate, and the first length is a length of the first adjustment block in a direction parallel to the surface of the base substrate. For example, in the plane perpendicular to the display substrate, the cross section of the first adjustment block is about a triangle or a semicircle. However, this embodiment is not limited thereto.

In some exemplary embodiments, a material of the first adjustment layer is an organic material. For example, the material of the first adjustment layer may be an acrylic material. However, this embodiment is not limited thereto.

In some exemplary embodiments, the first display region of the display substrate includes a base substrate, and a light shielding layer, a drive structure layer and a light-emitting element which are sequentially disposed on the base substrate; wherein, the light reflection layer and the light shielding layer are disposed at a same layer. However, this embodiment is not limited thereto. For example, the light reflection layer and a first gate metal layer in the drive structure layer may be disposed at a same layer.

In some exemplary embodiments, the display substrate includes a base substrate and a plurality of pixel units disposed on the base substrate. At least one pixel unit includes a plurality of sub-pixels, and at least one sub-pixel includes a light-emitting element and a pixel drive circuit that drives the light-emitting element to emit light. The light-emitting element includes a first electrode, a second electrode and an organic functional layer disposed between the first electrode and the second electrode, wherein the first electrode is located on a side of the second electrode close to the base substrate. The light adjustment layer includes a second adjustment layer, which is located on a side of the second electrode away from the light-emitting surface of the display substrate. In some examples, when the display substrate is a top emission structure, the second adjustment layer may be located on a side of the second electrode close to the base substrate. When the display substrate is a bottom emission structure, the second adjustment layer may be located on a side of the second electrode away from the base substrate, that is, a side close to an encapsulation layer. However, this embodiment is not limited thereto.

In some exemplary embodiments, the second adjustment layer includes a plurality of second adjustment blocks. An orthographic projection of at least one second adjustment block on the base substrate is located between orthographic projections of first electrodes of adjacent pixel units on the base substrate, and an area of the orthographic projection of the at least one second adjustment block between the first electrodes of adjacent pixel units is about half of an area of an orthographic projection of a second electrode between the first electrodes of adjacent pixel units.

In some exemplary embodiments, there is an orthographic projection of the second adjustment block on the base substrate between the orthographic projections of the first electrodes of the adjacent pixel units on the base substrate, and the orthographic projection of the second adjustment block on the base substrate is located in the middle of the first electrodes of the adjacent pixel units or close to a first electrode of one of the pixel units. Alternatively, there are orthographic projections of two second adjustment blocks on the base substrate between the orthographic projections of the first electrodes of the adjacent pixel units on the base substrate, and the orthographic projections of the two second adjustment blocks on the base substrate are respectively adjacent to a first electrode of one of the pixel units.

In some exemplary embodiments, a material of the second adjustment layer is an inorganic material, and a thickness of the second adjustment layer is about 1.8 microns to 3.8 microns. For example, the material of the second adjustment layer may include SiNx and $SiO_2$. However, this embodiment is not limited thereto.

In some exemplary embodiments, the first display region includes a base substrate, a display structure layer and a light-emitting element sequentially disposed on the base substrate. The second display region includes a base substrate and a light-emitting element disposed on the base substrate. The light-emitting element includes a first electrode, a second electrode and an organic functional layer disposed between the first electrode and the second electrode, wherein the first electrode is located on a side of the second electrode close to the base substrate. The light adjustment layer is located on a side of the first electrode close to the base substrate, and the first electrode is electrically connected with the display structure layer of the first display region through the light adjustment layer.

In some exemplary embodiments, the light adjustment layer includes at least one transparent wiring layer including a plurality of transparent wirings extending in a same direction; and the at least one transparent wiring has a wave shape. In this exemplary embodiment, the diffraction of the transparent wiring layer may be reduced by disposing the transparent wirings having the wave shape, and the problem with glare may also be improved thereby.

In some exemplary embodiments, the light adjustment layer includes a first transparent wiring layer and a second transparent wiring layer which are stacked. The first transparent wiring layer includes a plurality of first transparent wirings, and the second transparent wiring layer includes a plurality of second transparent wirings, and the first transparent wirings and the second transparent wirings extend in a same direction. The orthographic projections of the plurality of first transparent wirings of the first transparent wiring layer on the base substrate is staggered with the orthographic projection of the plurality of second transparent wirings of the second transparent wiring layer on the base substrate. In this exemplary embodiment, the diffraction of the transparent wiring layer may be reduced by disposing a double-layer transparent wiring having a way shape, and the problem with glare may also be improved thereby.

In some exemplary embodiments, the light adjustment layer includes at least one transparent wiring layer and a third adjustment layer. At least one transparent wiring layer includes a plurality of transparent wirings extending in a same direction, and the third adjustment layer fills gaps of a plurality of transparent wirings. The third adjustment layer in this exemplary embodiment reduces the diffraction of the transparent wiring layer and improves the glare.

In some exemplary embodiments, a thickness of a third adjustment layer is about 1.3 microns to 1.7 microns. In some examples, a material of a third adjustment layer is an inorganic material such as SiOx, and a thickness of the third adjustment layer is about 1.4 microns to 1.5 microns. In some examples, the material of the third adjustment layer is an organic material, and a thickness of the third adjustment layer is 1.5 microns to 1.6 microns. However, this embodiment is not limited thereto.

The display substrate according to this embodiment will be illustrated by a plurality of examples below.

FIG. 1 is a schematic plan view of a display region of a display substrate according to at least one embodiment of the present disclosure. As shown in FIG. 1, the display substrate of this exemplary embodiment includes a first display region 100 and a second display region 200. In this example, the second display region 200 is located in the middle of an upper half of the first display region 100. However, this embodiment is not limited thereto. For example, the second display region 200 may be located in the middle of a lower half of the first display region 100, a left half of the first display region 100, or a right half of the first display region 100. In another example, the second display region 200 may be located at an upper edge, a left edge, a right edge or a lower edge of the first display region 100.

In this exemplary embodiment, the light transmittance of the second display region 200 is greater than the light transmittance of the first display region 100. In some examples, the light transmittance of the second display region 200 may be made to be greater than the light transmittance of the first display region 100 by setting the density of pixel units in the second display region 200 smaller than that of pixel units in the first display region 100. For example, an interval of pixel units in the second display region 200 is larger than that of pixel units in the first display region 100. However, this embodiment is not limited thereto.

In some exemplary embodiments, the first display region 100 and the second display region 200 are provided with a plurality of pixel units regularly arranged. At least one of the plurality of pixel units may include a plurality of sub-pixels. For example, at least one pixel unit may include a first sub-pixel that emits light of a first color, a second sub-pixel that emits light of a second color, and a third sub-pixel that emits light of a third color. Each sub-pixel may include a light-emitting element and a pixel drive circuit for driving the light-emitting element to emit light. The pixel drive circuit in the first sub-pixel may be connected to a scanning signal line, the pixel drive circuit in the second sub-pixel may be connected to a data signal line, the pixel drive circuit in the third sub-pixel may be connected to a light-emitting signal line. And the pixel drive circuit is configured to receive a data voltage transmitted by the data signal line under the control of the scanning signal line and the light-emitting signal line, and output a corresponding current to the light-emitting element. The light-emitting elements in the first sub-pixel, the second sub-pixel and the third sub-pixel are respectively connected to the pixel drive circuits of the sub-pixels where the light-emitting elements are located. The light-emitting element is configured to emit light with a corresponding brightness in response to a current output by a pixel drive circuit of a sub-pixel where the light-emitting device is located.

In some exemplary embodiments, at least one pixel unit may include a red (R) sub-pixel, a green (G) sub-pixel, and a blue (B) sub-pixel, or may include a red sub-pixel, a green sub-pixel, a blue sub-pixel, and a white sub-pixel. However, this embodiment is not limited thereto.

In some exemplary embodiments, a shape of the sub-pixel in the pixel unit may be a rectangle, a rhombus, a pentagon, or a hexagon. When a single pixel unit includes three sub-pixels, the three sub-pixels may be arranged in parallel horizontally, in parallel vertically, or in a regular triangle shape. When the single pixel unit includes four sub-pixels, the four sub-pixels may be disposed in parallel horizontally, in parallel vertically, or a square shape. However, this embodiment is not limited to thereto.

In some exemplary embodiments, an optical device may be disposed at a side away from the light-emitting surface of the display substrate, and an orthographic projection of the optical device on the display substrate overlaps with the second display region. For example, the orthographic projection of the optical device on the display substrate is located in the second display region. In some examples, an optical device may include at least one of the following: a camera, a Time of Flight (TOF) element, an infrared lens, a floodlight sensing element, an ambient light sensor, and a dot matrix projector. For example, the camera and the TOF element may be disposed on a side away from a light-emitting surface of the second display region of the display substrate. Since the light transmittance of the second display region is greater than that of the first display region, the optical device may achieve light transmission through the second display region, which enhances the service performance of the optical device.

Taking the optical device disposed at a side away from the light-emitting surface of the display substrate being the TOF element as an example; the TOF element includes an emitting sensor and a receiving sensor. The TOF element can use the time of flight of light to measure a distance, for example, it may be used in face recognition. The emitting sensor of the TOF element may emit infrared, which is reflected by a measured object through the second display region and received by the receiving sensor after being irradiated to the measured object through the second display region. However, the infrared emitted by the emitting sensor has a reflection effect in a process of passing through the display substrate. For example, in a display substrate with a top emission structure, the reflectivity of a cathode of the light-emitting element of the display substrate to the infrared is about 63%, and the reflectivity of the base substrate of display substrate to the infrared is about 15%. In this way, the infrared reflection effect inside the display substrate will cause the receiving sensor to receive an interference infrared reflected inside the display substrate, resulting in inaccurate ranging and even a phenomenon of distance reversal.

Figure 2:
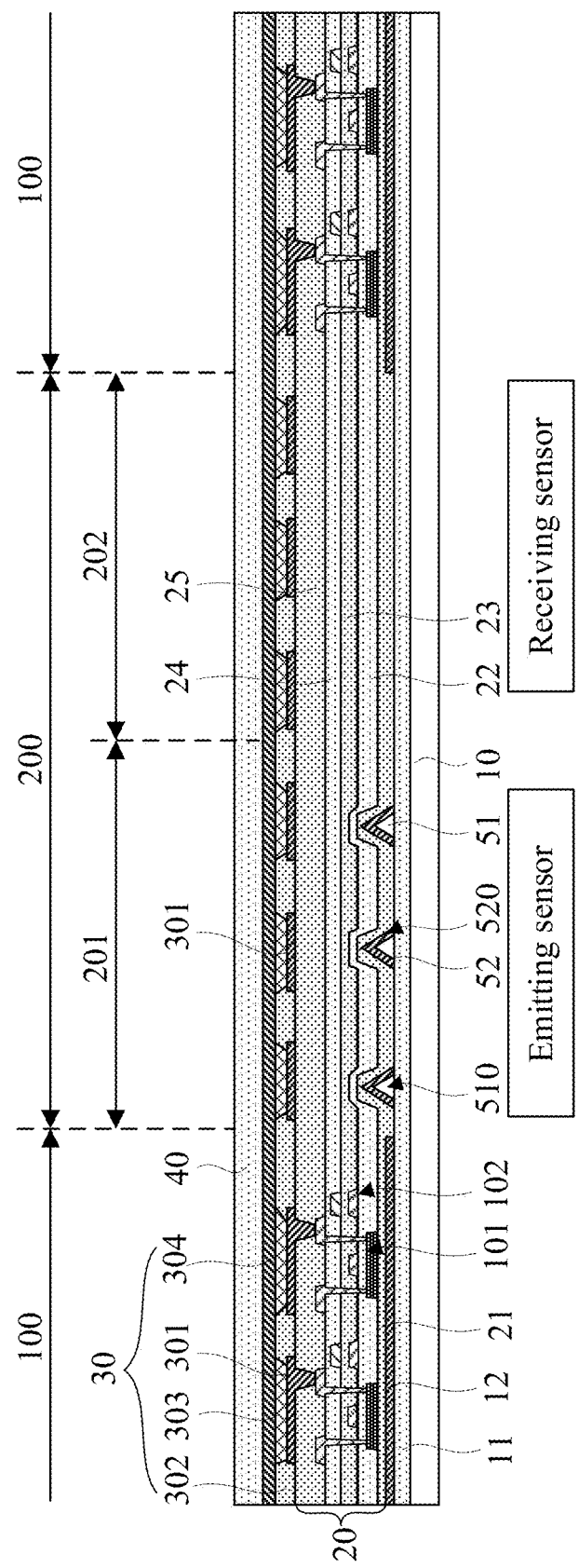
FIG. 2 is a partial schematic sectional view of a display substrate according to at least one embodiment of the present disclosure.

FIG. 2 is a partial schematic sectional view of a display substrate according to at least one embodiment of the present disclosure. FIG. 2 is a partial schematic sectional view along the P-P direction in FIG. 1. In FIG. 2, only several light-emitting elements in the second display region 200 are illustrated, and only a partial structure of four sub-pixels is illustrated in the first display region 100. However, this embodiment is not limited thereto.

In some exemplary embodiments, as shown in FIG. 2, in a plane perpendicular to the display substrate, the first display region 100 may include a base substrate 10, and a barrier layer 11, a light shielding (LS) layer 12, a drive structure layer 20, a light-emitting element 30, and an encapsulation layer 40 which are sequentially disposed on the base substrate 10. The light-emitting element 30 is located on a side of the drive structure layer 20 away from the base substrate 10, and the encapsulation layer 40 is located on a side of the light-emitting element 30 away from the base substrate 10. The light shielding layer 12 may shield external charges to protect the transistors in the drive structure layer 20. In some possible implementations, the display substrate may include other film layers, such as a spacer post, the present disclosure is not limited thereto.

In some exemplary embodiments, the base substrate 10 may be a flexible substrate or may be a rigid substrate. The drive structure layer 20 includes a plurality of pixel drive circuits. The pixel drive circuit includes a plurality of transistors and at least one storage capacitor. For example, the pixel drive circuit may have a 3T1C, 4T1C, 5T1C, 5T2C, 6T1C or 7T1C structure. In FIG. 2, a first thin film transistor 101 and a storage capacitor 102 included in each sub-pixel are taken as an example. In some examples, in a plane perpendicular to the display substrate, the drive structure layer 20 includes a first insulating layer 21, a semiconductor layer, a second insulating layer 22, a first gate metal layer, a third insulating layer 23, a second gate metal layer, a fourth insulating layer 24, a source-drain metal layer and a fifth insulating layer 25 which are sequentially disposed on the base substrate 10. The semiconductor layer at least includes an active layer of the first thin film transistor 101, the first gate metal layer at least includes a gate electrode of the first thin film transistor 101 and a first electrode of the storage capacitor 102, the second gate metal layer at least includes a second electrode of the storage capacitor 102, and the source-drain metal layer at least includes a source electrode and a drain electrode of the first thin film transistor 101. However, this embodiment is not limited thereto.

In some exemplary embodiments, the light-emitting element 30 may include a first electrode 301, a pixel define layer 302, an organic functional layer 303, and a second electrode 304. The first electrode 301 is located on a side of the second electrode 304 close to the base substrate 10. The first electrode 301 is connected to the drain electrode of the first thin film transistor 101 through a first via, the organic functional layer 303 is connected to the first electrode 301, the second electrode 304 is connected to the organic functional layer 303, and organic functional layer 303 emits light of corresponding colors under the driving of the first electrode 301 and the second electrode 304. In this example, the display substrate may have a top emission structure, and the light-emitting surface of the display substrate is away from a side of the base substrate 10. The first electrode 301 may be a reflective anode, and the second electrode 302 may be a transflective cathode.

In some exemplary implementations, the encapsulation layer 40 may include a first encapsulation layer, a second encapsulation layer and a third encapsulation layer that are stacked. The first encapsulation layer and the third encapsulation layer may be made of an inorganic material, and the second encapsulation layer may be made of an organic material; the second encapsulation layer is disposed between the first encapsulation layer and the third encapsulation layer to ensure that external moisture cannot enter into the light-emitting element 30.

In some exemplary embodiment, the organic functional layer 303 may include a Hole Injection Layer (HIL), a Hole Transport Layer (HTL), an Electron Block Layer (EBL), a light-emitting layer (EML), a Hole Block Layer (HBL), an Electron Transport Layer (ETL) and an Electron Injection Layer (EIL). In some examples, hole injection layers and electron injection layers of all sub-pixels may be connected together as a common layer, hole transport layers and electron transport layers of all sub-pixels may be connected together as a common layer, and hole block layers of all sub-pixels may be connected together as a common layer, and light-emitting layers and electron block layers of adjacent sub-pixels may be isolated or slightly overlap. However, this embodiment is not limited thereto.

In some exemplary embodiments, as shown in FIG. 2, the second display region 200 includes a first sub-display region 201 and a second sub-display region 202. An emitting sensor may be disposed on a side away from a light-emitting surface of the first sub-display region 201, and a receiving sensor may be disposed on a side away from a light-emitting surface of the second sub-display region 202. An orthographic projection of the emitting sensor on the base substrate 10 may be located in the first sub-display region 201, and an orthographic projection of the receiving sensor on the base substrate 10 may be located in the second sub-display region 202.

In some exemplary embodiments, as shown in FIG. 2, in a plane perpendicular to the display substrate, the first sub-display region 201 includes a base substrate 10, and a barrier layer 11, a light adjustment layer, a plurality of insulating layers, a light-emitting element 30, and an encapsulation layer 40 sequentially disposed on the base substrate 10. The light adjustment layer includes a first adjustment layer 51 and a light reflection layer 52 sequentially disposed on the barrier layer 11. The light reflection layer 52 covers a surface of the first adjustment layer 51 away from the base substrate 10. the surface of the first adjustment layer 51 away from the base substrate 10 is set to be convex, to achieve that the surface of the light adjustment layer close to the light-emitting surface of the display substrate is also be convex. The light-emitting element 30 may include a first electrode 301, a pixel define layer 302, an organic functional layer 303, and a second electrode 304. The first electrode 301 is located on a side of the second electrode 304 close to the base substrate 10. An orthographic projection of the first electrode 301 of the light-emitting element 30 on the base substrate 10 covers an orthographic projection of the light adjustment layer on the base substrate 10. The first electrode 301 may be connected to a pixel drive circuit disposed in the first display region 100 through a wiring. In this example, the pixel drive circuits of the sub-pixels of the second display region is disposed in the first display region to help to improve the light transmittance of the second display region.

In some exemplary embodiments, the plurality of insulating layers of the first sub-display region 201 include a first insulating layer 21, a second insulating layer 22, a third insulating layer 23, a fourth insulating layer 24 and a fifth insulating layer 25 which are stacked. The first to fourth insulating layers 21 to 24 may be inorganic insulating layers, and the fifth insulating layer 25 may be an organic insulating layer. However, this embodiment is not limited thereto.

In some exemplary embodiments, as shown in FIG. 2, the first adjustment layer 51 includes a plurality of first adjustment blocks 510, and the light reflection layer 52 includes a plurality of light reflection blocks 520. The plurality of light reflection blocks 520 are in one-to-one correspondence with the plurality of first adjustment blocks 510. The light reflection block 520 covers a corresponding first adjustment block 510. A cross section of the first adjustment block 510 has a shape in which a first length decreases gradually in a direction away from the surface of the base substrate 10, and the first length is a length of the first adjustment block 510 in a direction parallel to the surface of the base substrate 10. For example, the cross section of the first adjustment block 510 is approximately triangle, and one vertex of the triangle is away from the surface of the base substrate 10. However, this embodiment is not limited thereto.

In some exemplary embodiments, a material of the first adjustment layer 51 may be an organic material, and the light reflection layer 52 may be made of a metal material. The first adjustment layer 51 is disposed in the first sub-display region 201 to form a convex topography, and the light reflection layer 52 is disposed on a side of the first adjustment layer 51 away from the base substrate 10, so that the light reflection layer 52 also has a convex topography to change a reflection direction of infrared inside the display substrate.

In some exemplary embodiments, as shown in FIG. 2, the light reflection layer 52 may and the light shielding layer 12 of the first display region 100 are disposed at a same layer. However, this embodiment is not limited thereto. For example, the light reflection layer 52 may and the first gate metal layer of the drive structure layer 20 of the first display region 100 are disposed at a same layer.

In some exemplary embodiments, as shown in FIG. 2, in a plane perpendicular to the display substrate, the second sub-display region 202 includes a base substrate 10, and a barrier layer 11, a plurality of insulating layers, a light-emitting element 30, and an encapsulation layer sequentially disposed on the base substrate 10. The plurality of insulating layers include, for example, a first insulating layer 21 to a fifth insulating layer 25 which are stacked. The first electrode 301 of the light-emitting element 30 may be connected to a pixel drive circuit disposed in the first display region 100 through a wiring.

Figure 3:
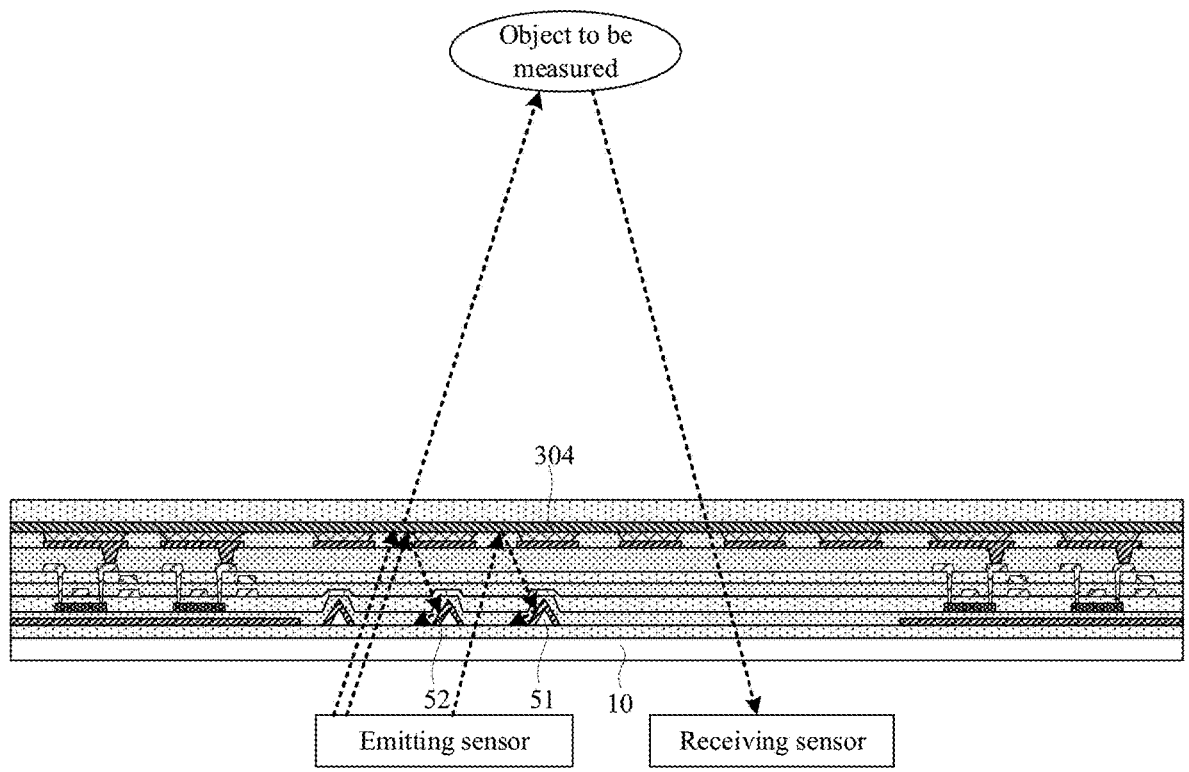
FIG. 3 is a schematic diagram of light transmission of a display substrate according to at least one embodiment of the present disclosure.

FIG. 3 is a schematic diagram of light transmission of a display substrate according to at least one embodiment of the present disclosure. The dashed line with an arrow in FIG. 3 indicates an infrared light transmission direction. As shown in FIG. 3, in this exemplary embodiment, a first adjustment layer 51 is disposed in the first sub-display region 201 to form a convex topography, and the light reflection layer 52 is disposed on a side of the first adjustment layer 51 away from the base substrate 10, so that the light reflection layer 52 also has a convex topography. the infrared emitted by the emitting sensor will continue to be reflected by the light reflection layer 52 with the convex topography after being reflected by the second electrode 304 inside the display substrate, thereby changing a reflection direction of the interference infrared inside the display substrate and preventing the receiving sensor from receiving the interference infrared, which improves the ranging accuracy of the TOF element and the service performance of the TOF element.

Figure 4:
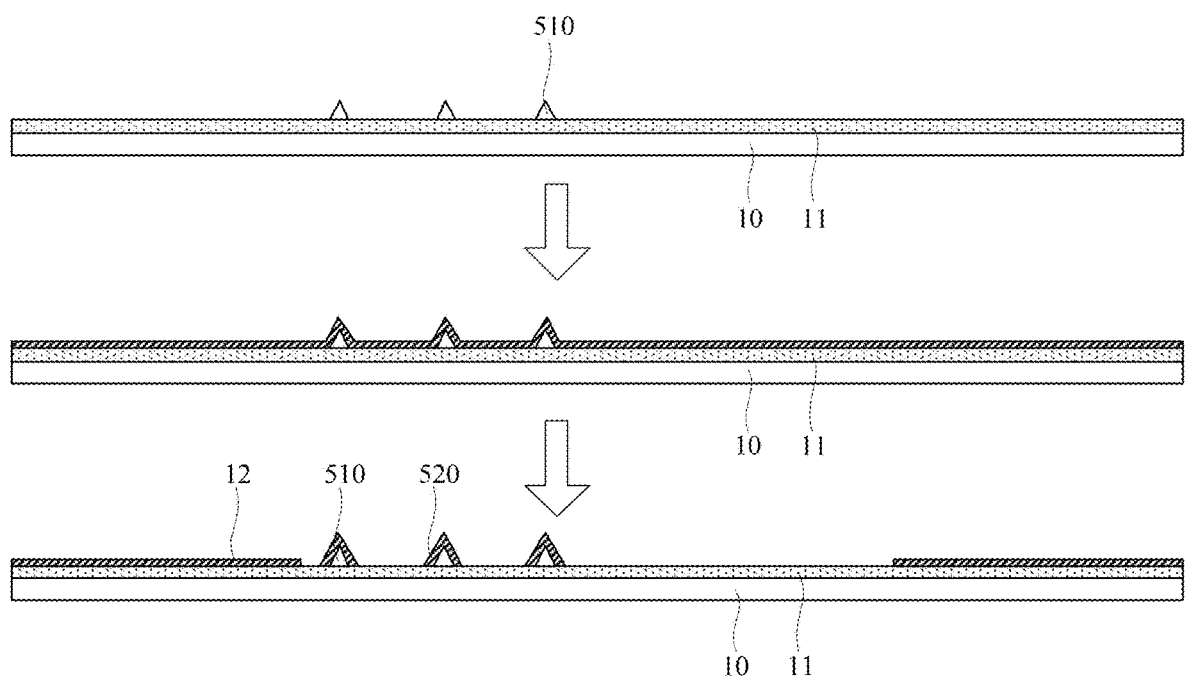
FIG. 4 is a schematic diagram of a part of a preparation process of a display substrate according to at least one embodiment of the present disclosure.

FIG. 4 is a schematic diagram of a part of a preparation process of a display substrate according to at least one embodiment of the present disclosure. In reference to FIG. 2 and FIG. 4, a structure of a display substrate according to the present disclosure is described below by an example of a preparation process of a display substrate. The "patterning process" mentioned in the present disclosure includes processes, such as film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. "thin film" refers to a thin film made of a material on a substrate using a deposition or coating process. If the "thin film" does not need a patterning process during the whole manufacturing process, the "thin film" may also be called a "layer". When the "thin film" needs a patterning process during the whole manufacturing process, it is called "thin film" before the patterning process and called "layer" after the patterning process. The "layer" after the patterning process includes at least one "pattern".

In the present disclosure, "A and B are disposed at a same layer" means that A and B are formed at the same time by the same patterning process. "Same layer" does not always mean that the thickness of the layer or the height of the layer are the same in the cross-sectional view. "An orthographic projection of A contains an orthographic projection of B" means that the orthographic projection of B falls within the scope of the orthographic projection of A, or the orthographic projection of A covers the orthographic projection of B.

In some exemplary embodiments, a preparation process of a display substrate of the present embodiment may include following acts (1) to (6).

(1) A base substrate is provided and a barrier layer is prepared on the base substrate.

In some exemplary embodiments, the base substrate 10 is a rigid base substrate, such as a glass base substrate. However, this embodiment is not limited thereto. For example, the base substrate 10 may be a flexible base substrate.

In some exemplary embodiments, a barrier thin film is deposited on the base substrate 10 to form a barrier layer 11 covering the base substrate 10, as shown in FIG. 4. The barrier layer 11 may be made of inorganic materials such as silicon nitride (SiNx) or silicon oxide (SiOx) to improve the water and oxygen resistance of the base substrate 10.

(2) A first adjustment layer is prepared on the base substrate.

In some exemplary embodiments, a first adjustment thin film is coated on the base substrate 10 with the aforementioned structure, and the first adjustment layer 51 is formed in a first sub-display region 201 through a patterning process, as shown in FIGS. 2 and 4. The first adjustment layer 51 includes a plurality of first adjustment blocks 510 which are isolated from each other and regularly arranged. A cross-sectional shape of the first adjustment block 510 is triangle, thereby forming a first adjustment layer 51 having a convex surface. In some examples, the first adjusting thin film may be made of organic materials such as acrylic.

After this patterning process, a film layer structure of the first display region 100 and the second sub-display region 202 remains unchanged.

(3) A light shielding layer and a light reflection layer are prepared on the base substrate.

In some exemplary embodiments, a first metal thin film is deposited on the base substrate with the aforementioned structure, and the first metal thin film is patterned through a patterning process to form a light shielding layer 12 and a light reflection layer 52, as shown in FIGS. 2 and 4. The light shielding layer 12 is located in the first display region 100, and the light reflection layer 52 is located in the first sub-display region 201. The light reflection layer 52 includes a plurality of light reflection blocks 520 which are in one-to-one correspondence with the plurality of first adjustment blocks 510. A light reflection block 520 covers a surface of a corresponding first adjustment block 510.

The film layer structure of the second sub-display region 202 remains unchanged after this patterning process.

(4) A drive structure layer is prepared on the base substrate.

In some exemplary embodiments, the drive structure layer 20 includes a plurality of pixel drive circuits, and at least one pixel drive circuit includes a plurality of transistors and at least one storage capacitor. The following takes a pixel drive circuit including a first thin film transistor 101 and a storage capacitor 102 as an example to explain the preparation process of the drive structure layer.

In some exemplary embodiments, a first insulating layer 21 and a semiconductor layer pattern disposed on the first insulating layer 21 are formed on the base substrate 10 with the aforementioned structure. As shown in FIG. 2, the semiconductor layer is formed in the first display region 100, and at least includes an active layer of the first thin film transistor 101.

Subsequently, a second insulating layer 22 covering the semiconductor layer pattern is formed; a second metal thin film is deposited on the second insulating layer 22 and is patterned through a patterning process to form a first gate metal layer pattern on the second insulating layer 22. As shown in FIG. 2, the first gate metal layer is located in the first display region 100, and at least includes a gate electrode of the first thin film transistor 101 and a first electrode of the storage capacitor 102.

Subsequently, a third insulating layer 23 covering the first gate metal layer is formed; a third metal thin film is deposited on the third insulating layer 23 and is patterned through a patterning process to form a second gate metal layer pattern disposed on the third insulating layer 23. As shown in FIG. 2, the second gate metal layer is located in the first display region 100 and at least includes a second electrode of the storage capacitor 102.

Subsequently, a fourth insulating layer 24 covering the second gate metal layer is formed, a plurality of first vias are disposed on the fourth insulating layer 24. A fourth metal thin film is deposited on the fourth insulating layer 24, and the fourth metal thin film is patterned through a patterning process to form a source-drain metal layer pattern, as shown in FIG. 2. The source-drain metal layer is located in the first display region 100, and at least includes a source electrode and a drain electrode of the first thin film transistor 101. The source electrode and the drain electrode of the first thin film transistor 101 are connected to the active layer through the first vias, respectively.

Subsequently, a fifth insulating layer 25 covering the source-drain metal layer is formed, and a plurality of second vias are disposed on the fifth insulating layer 25, at least one of which exposes a surface of the source electrode of the first thin film transistor 101. The fifth insulating layer 25 may be made of organic materials such as polyimide, acrylic or polyethylene terephthalate.

At this point, the drive structure layer of the first display region 100 is prepared on the base substrate 10, as shown in FIG. 2. After this process, the first sub-display region 201 includes the first insulating layer 21, the second insulating layer 22, the third insulating layer 23, the fourth insulating layer 24, and the fifth insulating layer 25 sequentially disposed on the light reflection layer 52. The second sub-display region 202 includes the first insulating layer 21, the second insulating layer 22, the third insulating layer 23, the fourth insulating layer 24, and the fifth insulating layer 25 sequentially disposed on the barrier layer 11.

In some exemplary embodiments, the first metal thin film, the second metal thin film, the third metal thin film and the fourth metal thin film may be made of metal materials, such as any one or more of silver (Ag), copper (Cu), aluminum (Al), titanium (Ti) and molybdenum (Mo), or alloy materials of the above metals, such as AlNd alloy or MoNb alloy, which may be a single-layer structure or a multilayer composite structure, such as Ti/Al/Ti, etc. The first insulating layer 21, the second insulating layer 22, the third insulating layer 23, and the fourth insulating layer 24 may be made of any one or more of silicon oxide (SiOx), silicon nitride (SiNx) and silicon oxynitride (SiON), and may be a single layer, a multiple layer, or a composite layer. The first insulating layer 21 may also be referred to as a buffer layer, which can be used to improve the water and oxygen resistance of the base substrate 10. The second insulating layer 22 may also be referred to as a first gate insulating layer, the third insulating layer 23 may also be referred to as a second gate insulating layer, and the fourth insulating layer 24 may also be referred to as an interlayer insulating layer. The semiconductor layer may be made of one of more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. The present disclosure is applicable to transistors that are manufactured based on oxide technology, silicon technology and organic technology.

(5) A light-emitting element is prepared on the base substrate.

In some exemplary embodiments, a first conductive thin film is deposited on the base substrate 10 with the aforementioned structure, and the first conductive thin film is patterned through a patterning process to form a pattern of a first electrode 301, as shown in FIG. 2. The pattern of the first electrode 301 is formed in the first display region 100 and the second display region 200. A first electrode 301 in the first display region 100 is connected to a drain electrode of the first thin film transistor 101 through a second via on the fifth insulating layer 25. A first electrode 301 in the second display region 200 is connected to a pixel drive circuit in the first display region 100 through a connection wiring. The connection wiring may be prepared on a same layer as the first electrode. Then, a pixel define thin film is coated, and a pattern of the pixel define layer 302 is formed through masking, exposure and development processes. The pixel define layer 302 is formed in the first display region 100 and the second display region 200. The pixel define layer 302 of the first display region 100 and the second display region 200 is provided with pixel openings, and the pixel define thin film in the pixel openings is developed to expose the surface of the first electrode 301. Subsequently, an organic functional layer 303 and a second electrode 304 are sequentially formed on the base substrate 10 formed with the aforementioned pattern. For example, the organic functional layer 303 includes a hole injection layer, a hole transport layer, a light-emitting layer, an electron transport layer, and an electron injection layer, which are stacked and formed in the pixel openings of the first display region 100 and the second display region 200 to achieve the connection between the organic functional layer 303 and the first electrode 301. Since the first electrode 301 is connected to the drain electrode of the first thin film transistor of the pixel drive circuit, the light-emitting control of the organic functional layer 303 is achieved. A part of the second electrode 304 is formed on the organic functional layer 303 to achieve the connection with the organic functional layer 303.

(6) An encapsulation layer is prepared on the base substrate.

In some exemplary embodiments, an encapsulation layer 40 is formed on the base substrate 10 with the aforementioned patterns. The encapsulation layer 40 may be formed in the first display region 100 and the second display region 200, and may adopt a laminated structure of inorganic material/organic material/inorganic material. The organic material layer is disposed between two inorganic material layers.

The preparation process according to this exemplary embodiment is achieved by using the existing mature preparation equipment, which may be well compatible with the existing preparation process, and has advantages of simple process realization, easy implementation, high production efficiency, low production cost and high yield rate.

The structure and preparation process of the display substrate according to this exemplary embodiment are merely illustrative. In some exemplary embodiments, according to actual needs, corresponding structures may be changed and patterning processes may be increased or reduced. For example, the light reflection layer of the first sub-display region may be disposed at a same layer as the first gate metal layer of the first display region, or as the second gate metal layer of the first display region. However, this embodiment is not limited thereto.

According to the display substrate provided by this exemplary embodiment, the light adjustment layer is disposed in the first sub-display region to change the reflection direction of interference infrared inside the display substrate, so that the receiving sensor of the TOF element is prevented from receiving interference infrared, thereby improving the ranging accuracy and the service performance of the TOF element.

The structure (or method) shown in the present embodiment may be appropriately combined with the structure (or method) shown in other embodiments.

Figure 5:
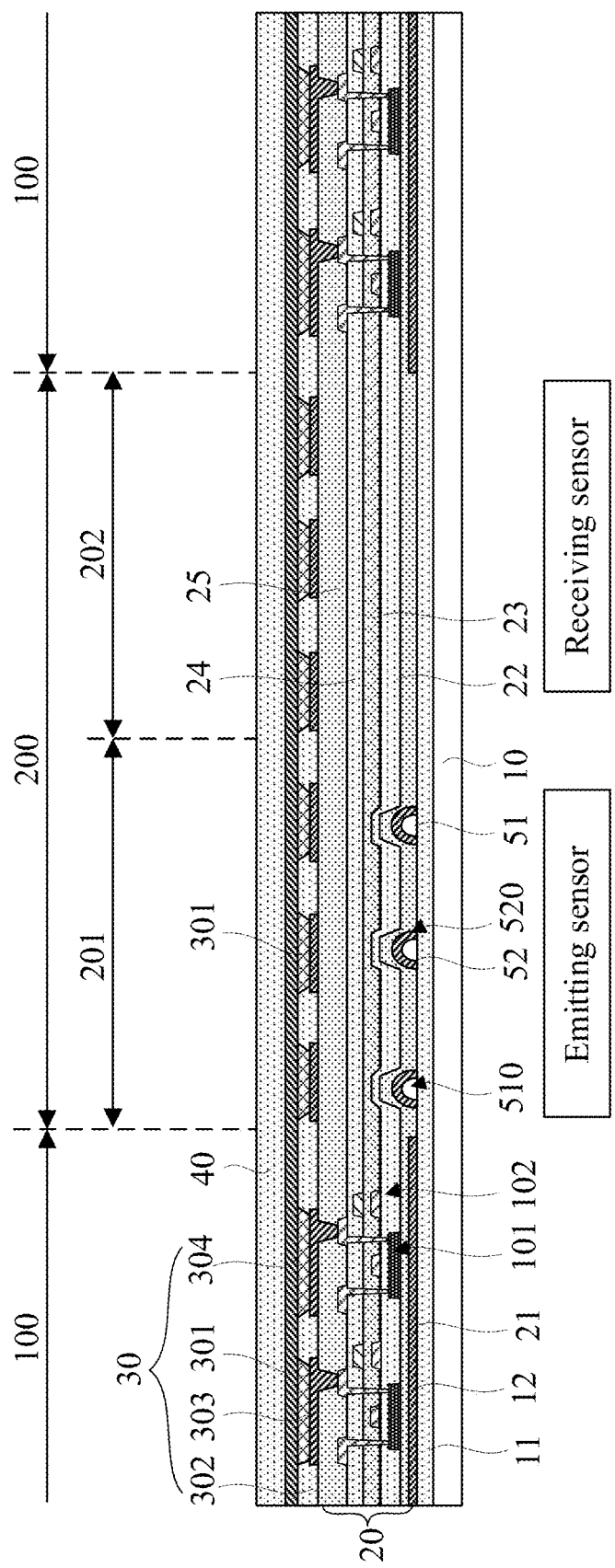
FIG. 5 is another schematic sectional view of a display substrate according to at least one embodiment of the present disclosure.

FIG. 5 is another schematic sectional view of a display substrate according to at least one embodiment of the present disclosure. In some exemplary embodiments, as shown in FIG. 5, in a plane perpendicular to the display substrate, a light adjustment layer disposed in the first sub-display region 201 includes a first adjustment layer 51 and a light reflection layer 52. The first adjustment layer 51 includes a plurality of first adjustment blocks 510, and the light reflection layer includes a plurality of light reflection blocks 520. The plurality of first adjustment blocks 510 are in one-to-one correspondence with the plurality of light reflection blocks 520. A cross section of the first adjustment block 510 has an arc-shaped top surface. For example, the cross section of the first adjustment block 510 is semicircular. In this exemplary embodiment, a first adjustment block with a circular arc-shaped top surface in cross section is disposed to make the light reflection layer to also have a convex topography, so as to change the reflection direction of interference infrared inside the display substrate, and the receiving sensor of the TOF element is prevented from receiving interference infrared, thereby improving the ranging accuracy and the service performance of the TOF element.

As to the description of other structures of the display region of this embodiment, reference may be made to the description of the previous embodiment, which hence will not be repeated here.

The structure (or method) shown in the present embodiment may be appropriately combined with the structure (or method) shown in other embodiments.

Figure 6:
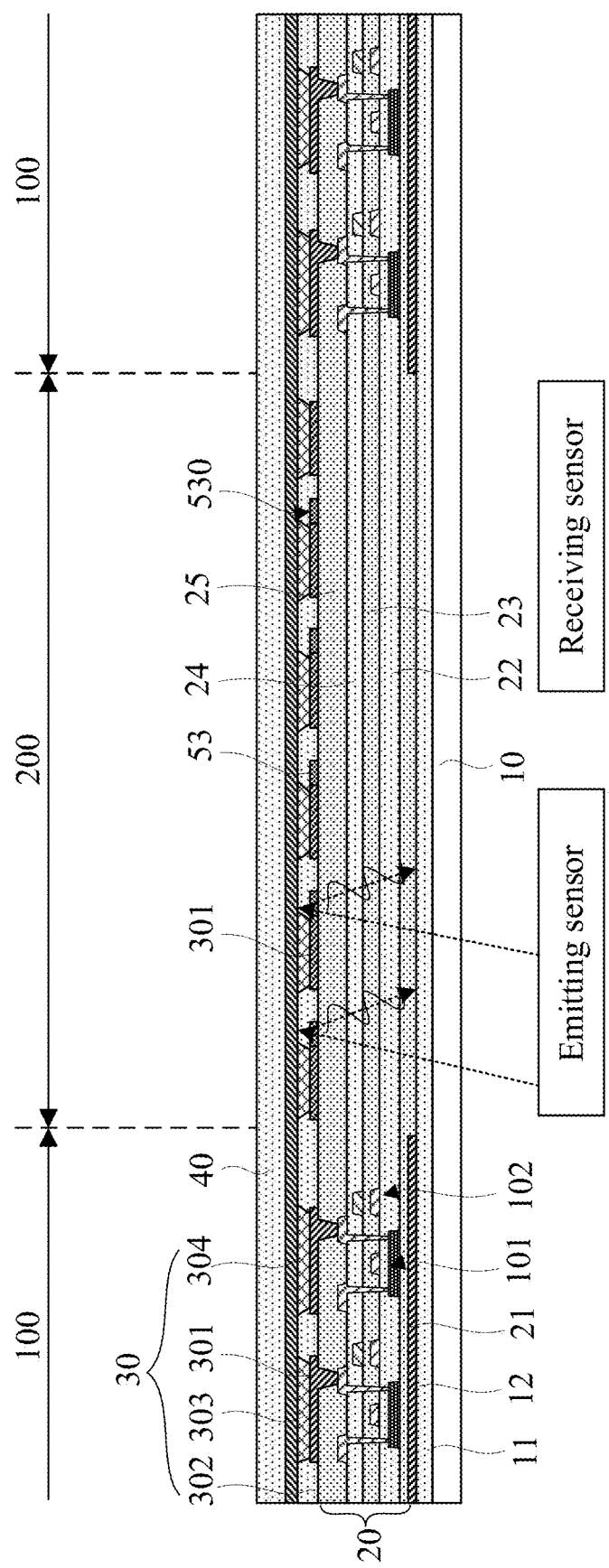
FIG. 6 is another schematic sectional view of a display substrate according to at least one embodiment of the present disclosure.
Figure 7:
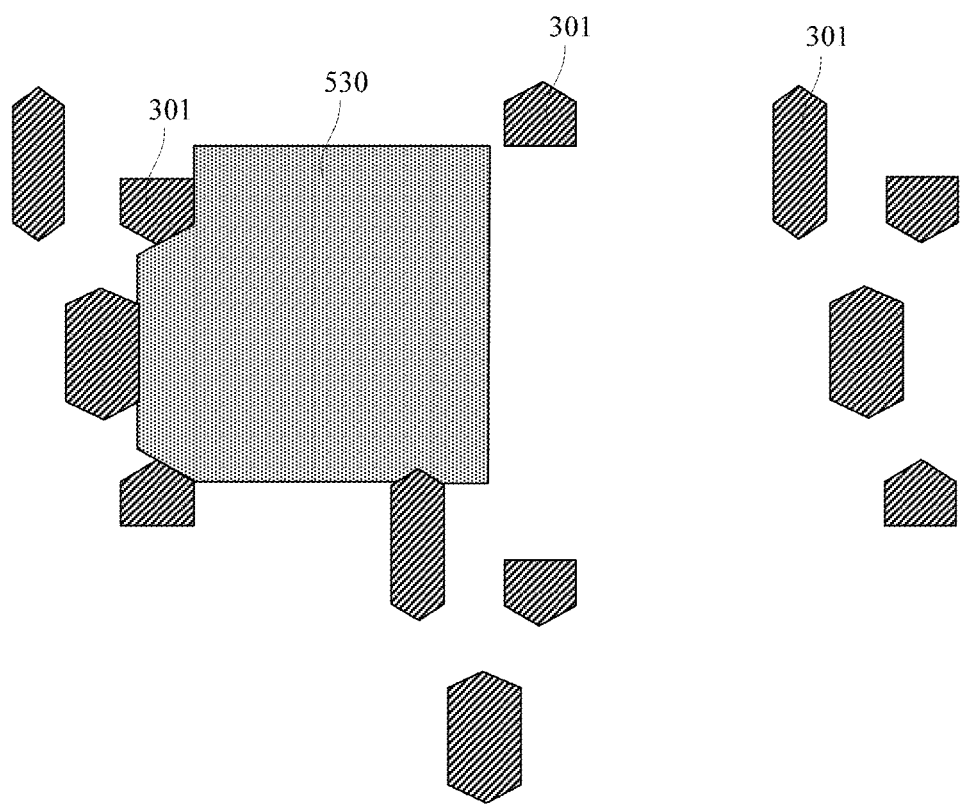
FIG. 7 is a schematic partial top view of a second display region according to at least one embodiment of the present disclosure.

FIG. 6 is another schematic sectional view of a display substrate according to at least one embodiment of the present disclosure. FIG. 7 is a partial top view of a second display region according to at least one embodiment of the present disclosure. As shown in FIG. 6, in a plane perpendicular to the display substrate, the second display region 200 includes a base substrate a barrier layer 11, a plurality of insulating layers, a light adjustment layer, a light-emitting element 30 and an encapsulation layer 40 disposed on the base substrate 10. The light adjustment layer includes a second adjustment layer 53 including a plurality of second adjustment blocks 530. The light-emitting element 30 includes a first electrode 301, a pixel define layer 302, an organic functional layer 303, and a second electrode 304. The first electrode 301 is located on a side of the second electrode 304 close to the base substrate 10. The second adjustment layer 53 is located on a side of the second electrode 304 close to the base substrate 10. The first electrode 301 may be connected to a pixel drive circuit disposed in the first display region 100 through a wiring. In this example, the pixel drive circuits of the sub-pixels of the second display region 200 are disposed in the first display region 100 to help to improve the light transmittance of the second display region 200.

In some exemplary embodiments, the display substrate is a top emission structure. The first electrode 301 of the light-emitting element 30 is a reflective anode, and the second electrode 304 is a transflective cathode. However, this embodiment is not limited thereto. In some examples, the display substrate may have a bottom emission structure, and the light-emitting surface of the display substrate is away from the encapsulation layer. A first electrode may be a transparent anode, and a second electrode may be a reflective cathode. At this time, a second adjustment layer may be located on a side of a second electrode away from the base substrate. For example, the second adjustment layer may be located between the second electrode and the encapsulation layer.

In some exemplary embodiments, as shown in FIGS. 6 and 7, the second adjustment layer 53 includes a plurality of second adjustment blocks 530. A second adjustment block 530 is disposed between the first electrodes 301 of adjacent pixel units. An orthographic projection of the second adjustment block 530 on the base substrate 10 is located within an interval between the first electrodes of adjacent pixel units and adjacent to a first electrode 301 of one of the pixel units. In this example, one pixel unit may include three sub-pixels of different colors. In some examples, a plurality of sub-pixels in the first display region 100 and the second display region 200 may be arranged according to a repeating unit of two first sub-pixels, one second sub-pixel and one third sub-pixel on each row, and the two first sub-pixels in the repeating unit are arranged in a column direction, and sub-pixels of the same color are staggered in a row direction. For example, a first sub-pixel may be represented as pentagonal, and second sub-pixels may be represented as hexagonal as the third sub-pixels. The first sub-pixel may be a green sub-pixel, the second sub-pixel may be a blue sub-pixel, and the third sub-pixel may be a red sub-pixel. However, this embodiment is not limited thereto.

In some examples, as shown in FIG. 7, the second adjustment block 53 may have an irregular shape. For example, an edge of the second adjustment block 530 located between the first electrodes 301 of adjacent pixel units may match an edge of the adjacent first electrodes 301. However, this embodiment is not limited thereto.

In some exemplary embodiments, as shown in FIG. 6 and FIG. 7, an orthographic projection of the second electrode 304 of the display substrate on the base substrate 10 may cover the orthographic projection of a plurality of first electrodes 301 on the base substrate 10. An area of the orthographic projection of the second adjustment block 530 located between the first electrodes 301 of adjacent pixel units may be about half of an area of the orthographic projection of the second electrode 304 between the first electrodes 301 of adjacent pixel units. However, this embodiment is not limited thereto.

In some exemplary embodiments, in the preparation process of the display substrate, after the first electrode 301 of the light-emitting element 30 is formed on the base substrate 10, a second adjusting thin film is deposited in the second display region 200, and the second adjusting thin film is patterned through a patterning process to form the second adjustment layer 53. The second adjustment layer 53 is located in the second display region 200. Subsequently, a pixel define layer 302, an organic functional layer 303, and a second electrode 304 are sequentially formed in the first display region 100 and the second display region 200. However, this embodiment is not limited thereto. In some examples, a second adjustment layer 53 may be prepared after the pixel define layer 304 is formed, or the second adjustment layer 53 may be prepared after the organic functional layer 303 is formed.

In some exemplary embodiments, a material of the second adjustment layer 53 is an inorganic material, such as SiNx or $SiO_2$. However, this embodiment is not limited thereto. In some examples, the material of the second adjustment layer may be an organic material, such as an organic material with an extinction coefficient close to 0.

In some exemplary embodiments, the material of the second adjustment layer may include SiNx. Taking a display substrate with top emission structure as an example, the refractive index $n_1$ of the pixel define layer at 940 nm is about 1.624, the refractive index $n_2$ of the second electrode at 940 nm is about 0.346, and the critical angle of total reflection at the interface between them is arcsin $n_2/n_2=12.3°$. The crosstalk in the display substrate may be minimized by eliminating the infrared reflection at the total reflection angle. The refractive index $n_3$ of SiNx at 940 nm is about 1.806. Complete interference cancellation may be achieved when a thickness d of the second adjustment layer satisfies $(n_3-n_1)d/\cos 12.3°=940/2$. According to calculation, d=2491.3 nm, i.e. 2.49 um. Therefore, the thickness d of the second adjustment layer is set to be about 2 μm to 3 um, the interference cancellation may be achieved to a greater extent, and the reflection of infrared by the second electrode in the display substrate may be reduced.

In some exemplary embodiments, the material of the second adjustment layer may include $SiO_2$. Taking a display substrate with a top emission structure as an example, the refractive index $n_1$ of the pixel define layer at 940 nm is about 1.624, the refractive index $n_2$ of the second electrode at 940 nm is about 0.346, and the critical angle of total reflection at the interface between them is arcsin $n_2/n_1=12.3°$. The crosstalk in the display substrate may be minimized by eliminating the infrared reflection at the total reflection angle. The refractive index $n_3$ of $SiO_2$ at 940 nm is about 1.454. Complete interference cancellation may be achieved when the thickness d of the second adjustment layer satisfies $(n_1-n_3)d/\cos 12.3=940/2$. According to calculation, d=2667.1 nm, i.e. 2.67 μm. Therefore, the thickness d of the second adjustment layer is set to be about 2.5 um to 3.5 um, so that interference cancellation may be achieved to a greater extent, and the reflection of infrared by the second electrode in the display substrate may be reduced.

In this exemplary embodiment, a second adjustment layer is disposed on a side of the second electrode close to the base substrate, so that the reflection of infrared by the second electrode may be reduced by using the interference principle, thereby improving the crosstalk problem of the TOF element, which also increases the ranging accuracy of the TOF element and the service performance of the TOF element.

As to the description of other structures of the display region of this embodiment, reference may be made to the description of the previous embodiment, which hence will not be repeated here.

The structure (or method) shown in the present embodiment may be appropriately combined with the structure (or method) shown in other embodiments.

Figure 8:
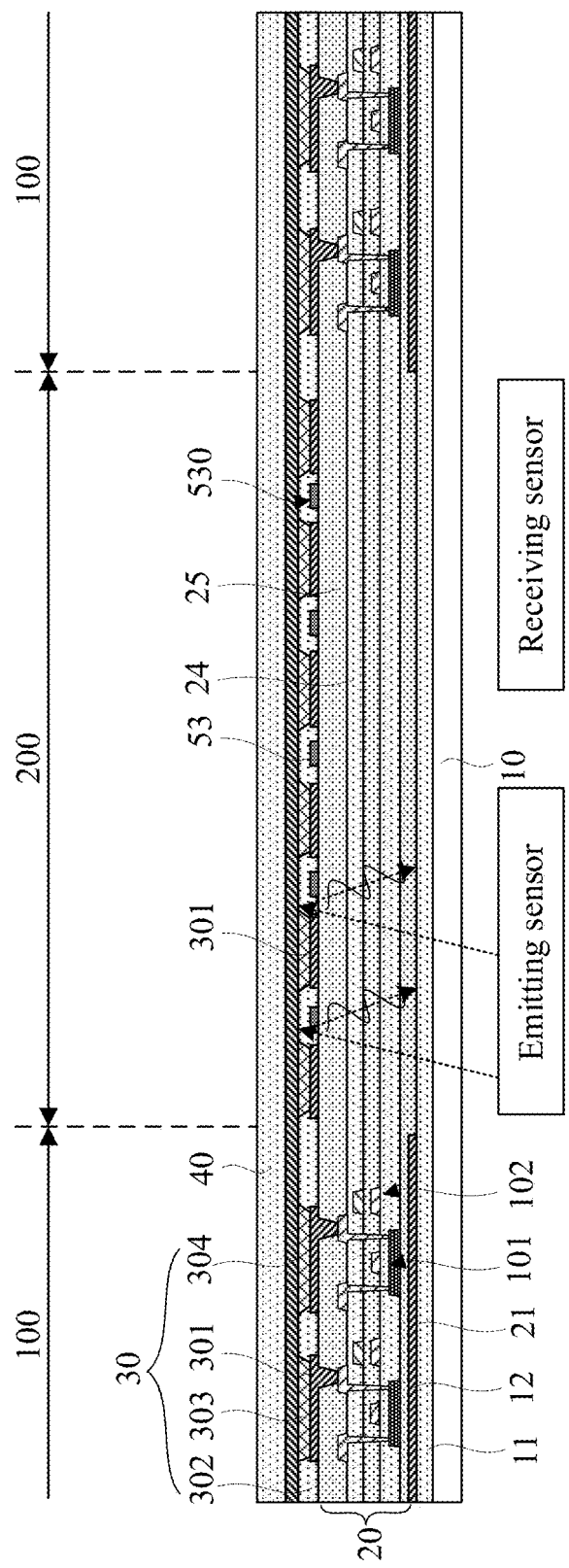
FIG. 8 is another schematic sectional view of a display substrate according to at least one embodiment of the present disclosure.
Figure 9:
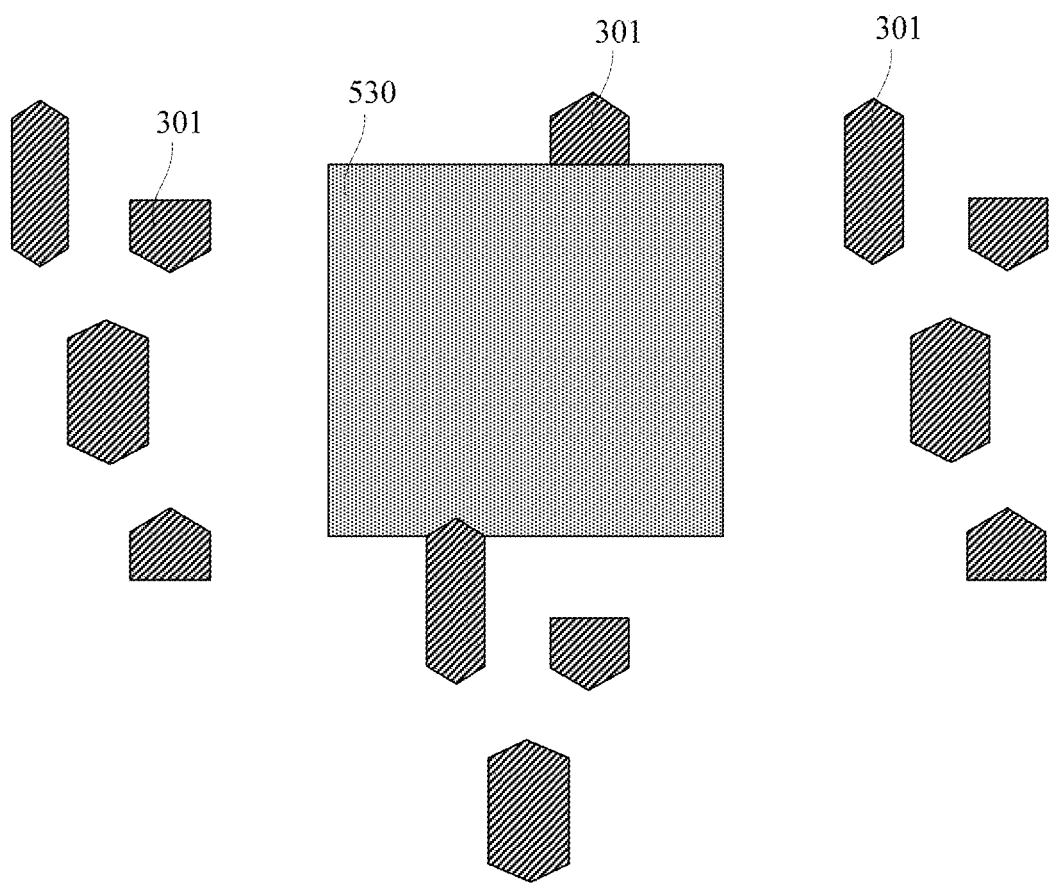
FIG. 9 is a schematic partial top view of a second display region according to at least one embodiment of the present disclosure.

FIG. 8 is another schematic sectional view of a display substrate according to at least one embodiment of the present disclosure. FIG. 9 is a partial top view of a second display region according to at least one embodiment of the present disclosure. As shown in FIG. 8 and FIG. 9, a second adjustment layer 53 of a second display region 200 includes a plurality of second adjustment blocks 530. A second adjustment block 530 is disposed between the first electrodes 301 of adjacent pixel units. An orthographic projection of the second adjustment block 530 on the base substrate 10 is located in the middle of the first electrodes 301 of the adjacent pixel unit. An orthographic projection of the second electrode 304 of the display substrate on the base substrate 10 may cover orthographic projections of a plurality of first electrodes 301 on the base substrate 10. An area of the orthographic projection of the second adjustment block 530 located between the first electrodes 301 of adjacent pixel units may be about half of an area of the orthographic projection of the second electrode 304 between the first electrodes 301 of adjacent pixel units. However, this embodiment is not limited thereto.

In this exemplary embodiment, the second adjustment layer is disposed on a side of the second electrode close to the base substrate, so that the reflection of infrared by the second electrode may be reduced by using the interference principle, thereby improving the crosstalk problem of the TOF element, which also increases the ranging accuracy of the TOF element and the service performance of the TOF element.

As to the description of other structures of the display region of this embodiment, reference may be made to the description of the previous embodiment, which hence will not be repeated here.

The structure (or method) shown in the present embodiment may be appropriately combined with the structure (or method) shown in other embodiments.

Figure 10:
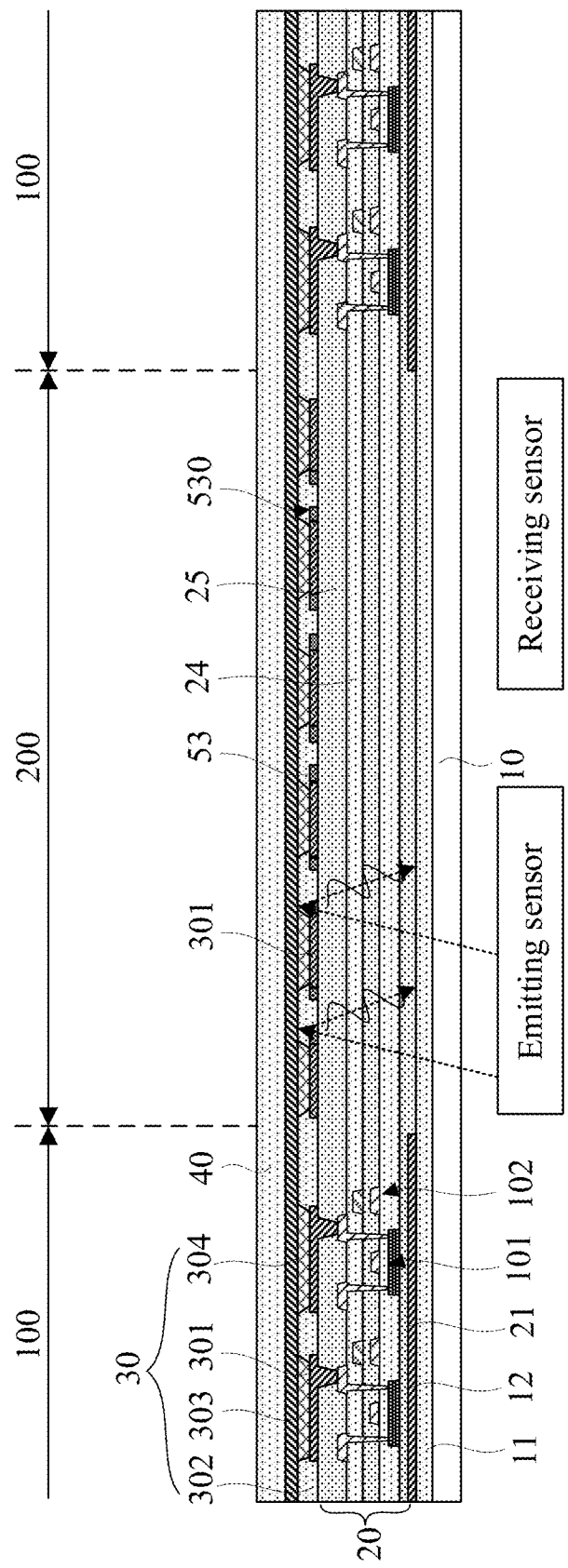
FIG. 10 is another schematic sectional view of a display substrate according to at least one embodiment of the present disclosure.
Figure 11:
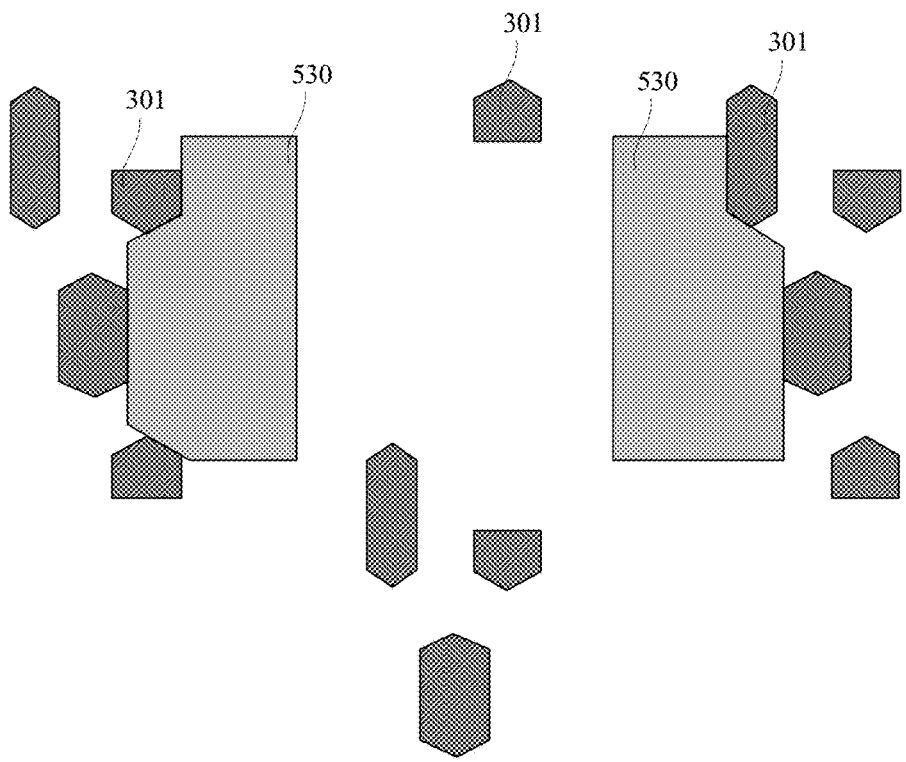
FIG. 11 is a schematic partial top view of a second display region according to at least one embodiment of the present disclosure.

FIG. 10 is another schematic sectional view of a display substrate according to at least one embodiment of the present disclosure. FIG. 11 is a partial top view of a second display region according to at least one embodiment of the present disclosure. As shown in FIG. 10 and FIG. 11, a second adjustment layer 53 of a second display region 200 includes a plurality of second adjustment blocks 530. Two second adjustment blocks 530 are disposed between the first electrodes 301 of adjacent pixel units. Orthographic projections of the two second adjustment blocks 530 on the base substrate 10 are located between the first electrodes 301 of adjacent pixel units and are adjacent to a first electrode 301 of one of the pixel units. An orthographic projection of the second electrode 304 of the display substrate on the base substrate 10 may cover orthographic projections of a plurality of first electrodes 301 on the base substrate 10. A sum of the areas of the orthographic projections of the two second adjustment blocks 530 located between the first electrodes 301 of adjacent pixel units may be about half of an area of the orthographic projection of the second electrode 304 between the first electrodes 301 of adjacent pixel units. However, this embodiment is not limited thereto.

In this exemplary embodiment, the second adjustment layer is disposed on a side of the second electrode close to the base substrate, so that the reflection of infrared by the second electrode may be reduced by using the interference principle, thereby improving the crosstalk problem of the TOF element, which also increases the ranging accuracy of the TOF element and the service performance of the TOF element.

As to the description of other structures of the display region of this embodiment, reference may be made to the description of the previous embodiment, which hence will not be repeated here.

The structure (or method) shown in the present embodiment may be appropriately combined with the structure (or method) shown in other embodiments.

Figure 12:
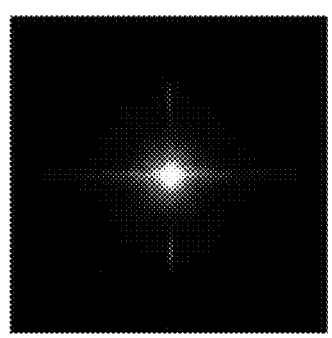
FIG. 12 is a schematic diagram of star glare generated by a display substrate.
Figure 13:
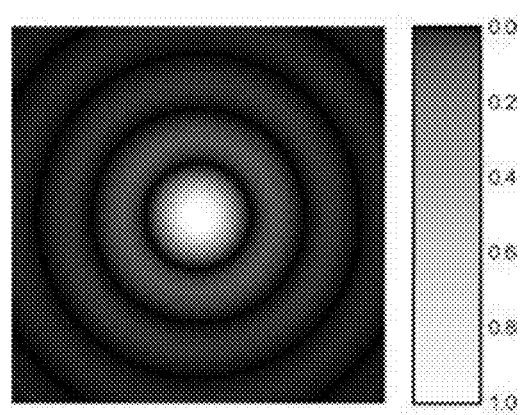
FIG. 13 is a schematic diagram of simulation data of star glare generated by a display substrate.

In some exemplary embodiments, the camera disposed at a side away from the light-emitting surface of the second display region in the display substrate is taken as an example. In order to increase the light transmittance of the second display region, pixel drive circuits of sub-pixels of the second display region may be disposed in the first display region, and light-emitting elements of the sub-pixels of the second display region may be connected to pixel drive circuits of the first display region through transparent wirings disposed in the second display region. However, after a plurality of parallel straight transparent wirings are disposed in the second display region, the grating formed by the transparent wirings will diffract light, such as rainbow-like star glare, as shown in FIG. 12. According to the diffraction Airy disk diameter r=1.22λf/s, where r is Airy disk diameter, s is slit width, f is lens focal length and λ is wavelength, it can be seen from the above formula that the longer the wavelength is, the larger the diffraction radius has. Therefore, red (about 620 nm in wavelength) glare is at the outermost side, green (about 550 nm in wavelength) glare is at the middle, and blue (about 460 nm in wavelength) glare is at the innermost side. FIG. 13 is simulation data of star glare of a display substrate, in which the unit of the right scale is micron.

Figure 14:
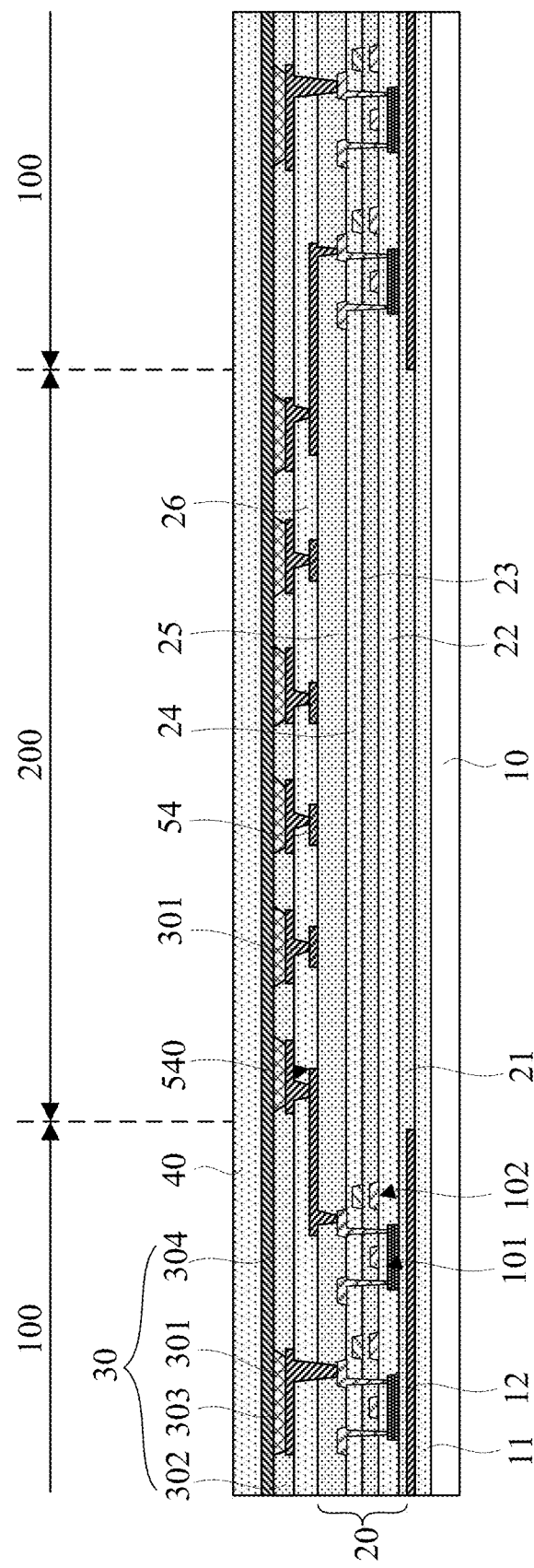
FIG. 14 is a schematic sectional view of a display substrate according to at least one embodiment of the present disclosure.
Figure 15:
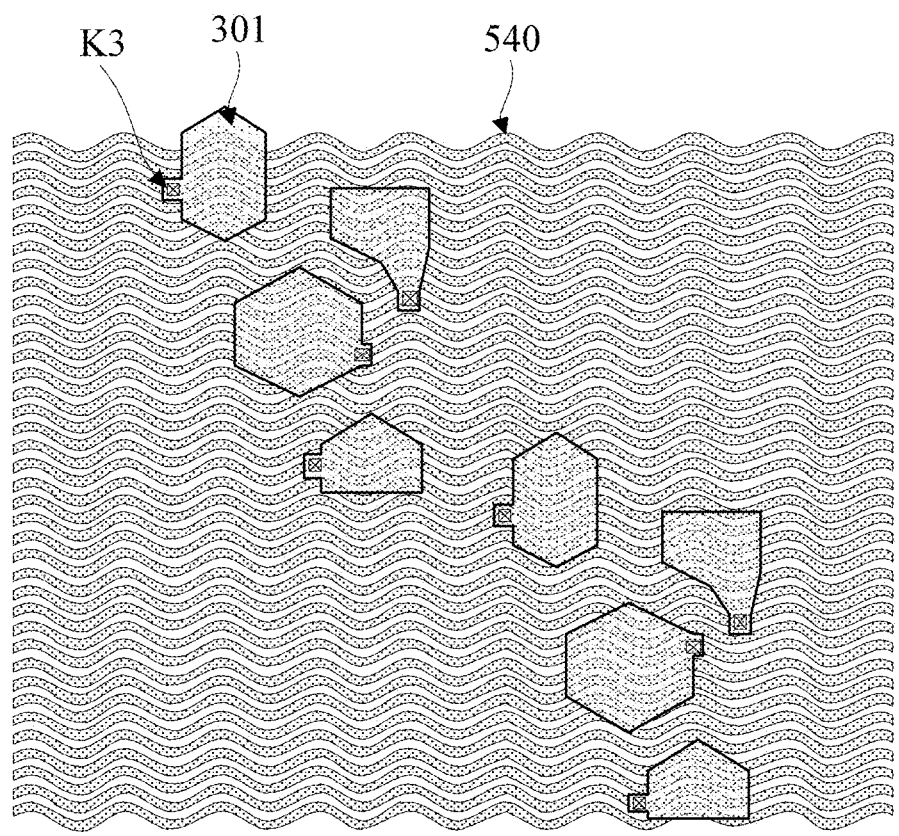
FIG. 15 is a schematic partial top view of a second display region according to at least one embodiment of the present disclosure.

FIG. 14 is a schematic sectional view of a display substrate according to at least one embodiment of the present disclosure. FIG. 15 is a schematic partial top view of a second display region according to at least one embodiment of the present disclosure. As shown in FIG. 14 and FIG. 15, in some exemplary embodiments, in a plane perpendicular to the display substrate, the second display region 200 includes a base substrate 10, a barrier layer 11, a plurality of insulating layers, a light adjustment layer, a light-emitting element 30 and an encapsulation layer 40 disposed on the base substrate 10. The light adjustment layer includes a first transparent wiring layer 54, which includes a plurality of first transparent wirings 540 extending in a same direction. The plurality of insulating layers includes a first insulating layer 21, a second insulating layer 22, a third insulating layer 23, a fourth insulating layer 24 and a fifth insulating layer 25 which are sequentially stacked. A sixth insulating layer 26 is disposed between the light adjustment layer and a first electrode 301 of the light-emitting element 30. In some examples, the first to fourth insulating layers 21 to 24 are inorganic insulating layers, and the fifth and sixth insulating layers 25 and 26 are organic insulating layers. However, this embodiment is not limited thereto.

In some exemplary embodiments, the light-emitting element 30 includes a first electrode 301, a pixel define layer 302, an organic functional layer 303, and a second electrode 304. The first electrode 301 is located on a side of the second electrode 304 close to the base substrate 10. The first transparent wiring layer 54 is located on a side of the first electrode 301 close to the base substrate 10. The first transparent wiring 540 may extend from the second display region 200 to the first display region 100 to connect a pixel drive circuit driving a light-emitting element of the second display region 200 in the first display region 100. For example, the first transparent wiring 540 may be connected to a pixel drive circuit in the first display region 100 through a second via formed on the fifth insulating layer 25. The first electrode 301 of the light-emitting element 30 in the second display region 200 may be connected to the first transparent wiring 540 through a third via K3 formed on the sixth insulating layer 26. In this example, the first electrode 301 of the light-emitting element 30 in the second display region 200 may be connected to the pixel drive circuit disposed in the first display region 100 through at least one first transparent wiring 540. However, this embodiment is not limited thereto.

In this exemplary embodiment, as shown in FIG. 15, a plurality of first transparent wirings 540 have a wave shape in a plane parallel to the display substrate. The wave shape may have any curvature and radian, which is not limited by this embodiment. In some examples, the first transparent wiring layer 54 may be made of transparent conductive materials such as ITO.

In an exemplary embodiment, the display substrate may be a top emission structure. However, this embodiment is not limited thereto.

In this exemplary embodiment, the transparent wiring connecting the first electrode and the pixel drive circuit is set to be a wavy shape, so that diffraction in the second display region may be reduced, thereby improving the problem with glare.

As to the description of other structures of the display region of this embodiment, reference may be made to the description of the previous embodiment, which hence will not be repeated here.

The structure (or method) shown in the present embodiment may be appropriately combined with the structure (or method) shown in other embodiments.

Figure 16:
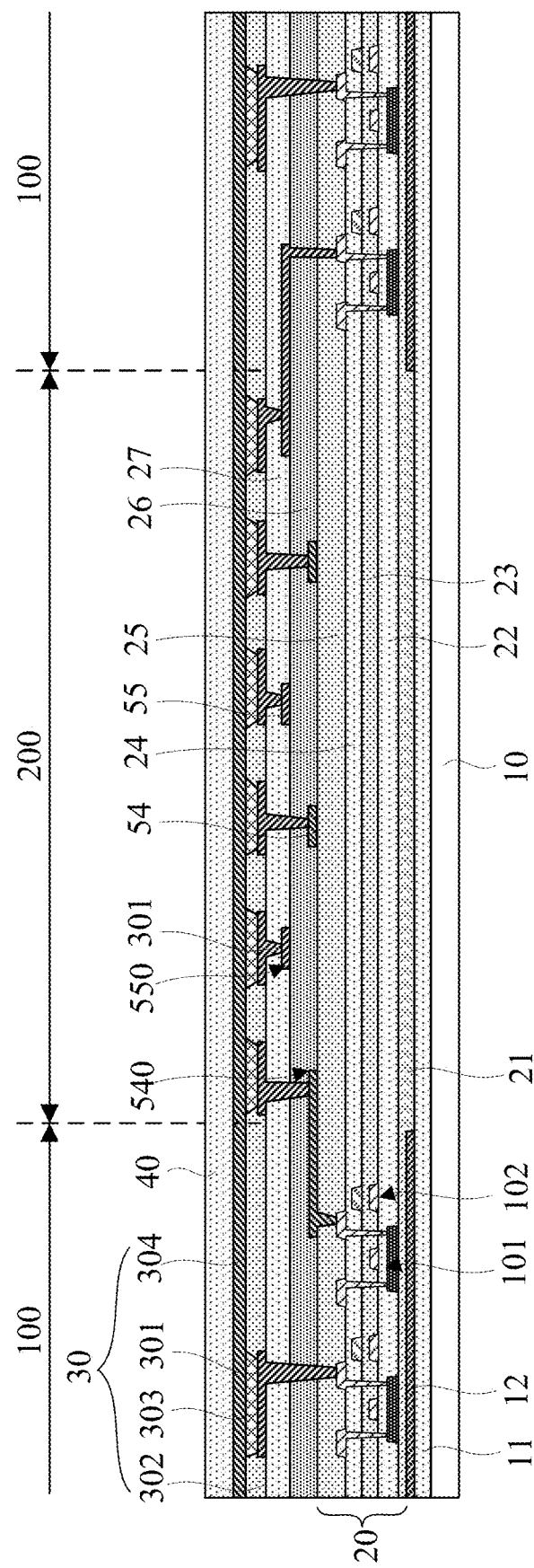
FIG. 16 is another schematic sectional view of a display substrate according to at least one embodiment of the present disclosure.
Figure 17:
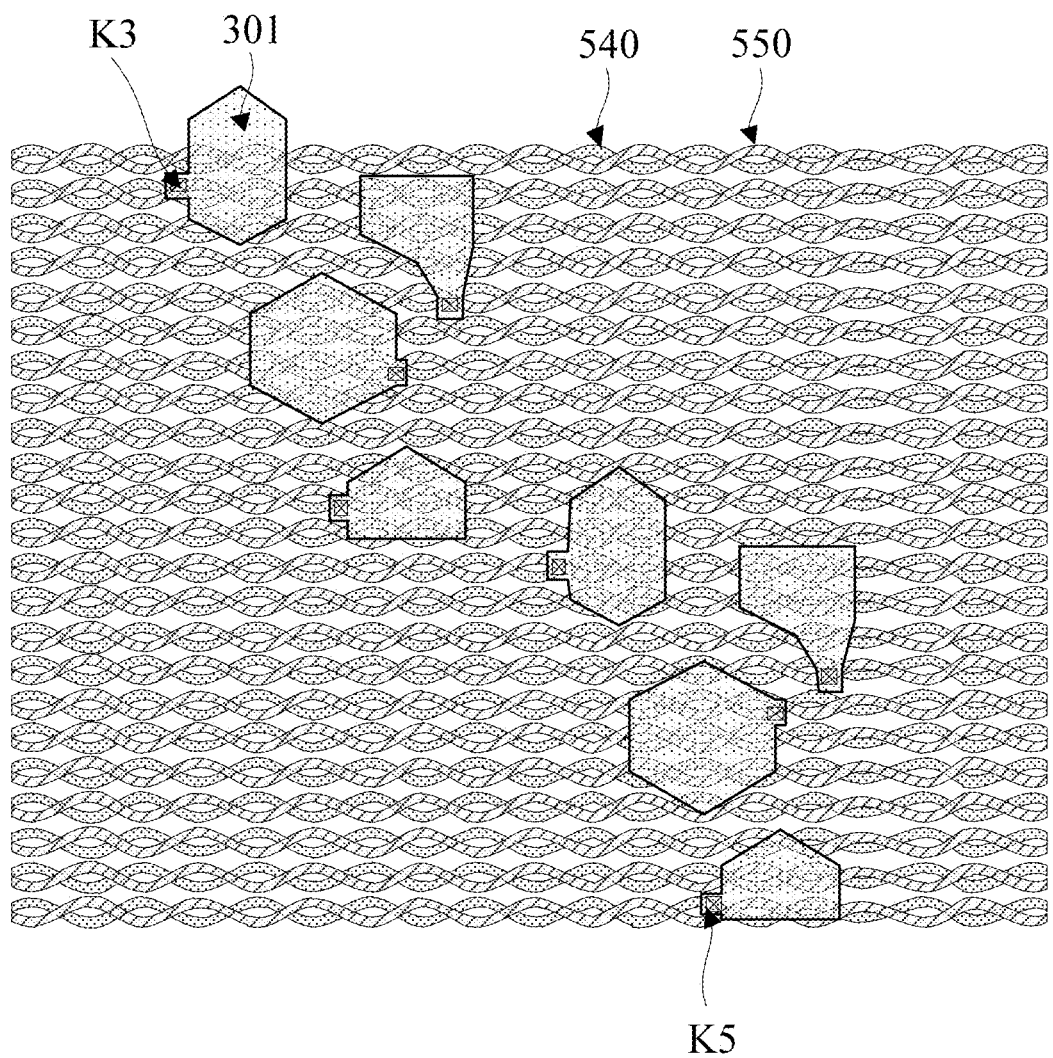
FIG. 17 is a schematic partial top view of a second display region according to at least one embodiment of the present disclosure.

FIG. 16 is another schematic sectional view of a display substrate according to at least one embodiment of the present disclosure. FIG. 17 is a schematic partial top view of a second display region of a display substrate according to at least one embodiment of the present disclosure. In some exemplary embodiments, as shown in FIG. 16 and FIG. 17, in some exemplary embodiments, in a plane perpendicular to the display substrate, a second display region 200 includes a base substrate 10, and a barrier layer 11, a plurality of insulating layers, a light adjustment layer, a light-emitting element 30 and an encapsulation layer 40 disposed on the base substrate 10. The light adjustment layer of the second display region 200 includes a first transparent wiring layer 54 and a second transparent wiring layer 55 sequentially disposed on the base substrate 10. The first transparent wiring layer 54 includes a plurality of first transparent wirings 540, and the second transparent wiring layer 55 includes a plurality of second transparent wirings 550. The first transparent wirings 540 and the second transparent wirings 550 extend in the same direction. The plurality of insulating layers includes a first insulating layer 21, a second insulating layer 22, a third insulating layer 23, a fourth insulating layer 24 and a fifth insulating layer 25 which are sequentially stacked. A sixth insulating layer 26 is disposed between the first transparent wiring layer 54 and the second transparent wiring layer 55. A seventh insulating layer 27 is disposed between the second transparent wiring layer and the first electrode 301 of the light-emitting element 30. In some examples, the first to fourth insulating layers 21 to 24 are inorganic insulating layers, and the fifth, sixth and seventh insulating layers 25, 26 and 27 are organic insulating layers. However, this embodiment is not limited thereto.

In some exemplary embodiments, the light-emitting element 30 includes a first electrode 301, a pixel define layer 302, an organic functional layer 303, and a second electrode 304. The first electrode 301 is located on a side of the second electrode 304 close to the base substrate 10. The second transparent wiring layer 55 is located on a side of the first electrode 301 close to the base substrate 10, and the first transparent wiring layer 54 is located on a side of the second transparent wiring layer 55 close to the base substrate 10. The first transparent wirings 540 and the second transparent wirings 550 may each extend from the second display region 200 to the first display region 100 to connect a pixel drive circuit driving a light-emitting element of the second display region 200 in the first display region 100. For example, the first transparent wiring 540 may be connected to a pixel drive circuit in the first display region 100 through a second via formed on the fifth insulating layer 25, and the second transparent wiring 550 may be connected to the pixel drive circuit in the first display region 100 through a fourth via formed on the sixth insulating layer 26. The first electrode 301 of the light-emitting element 30 in the second display region 200 may be connected to the second transparent wiring 550 through a third via K3 formed on the seventh insulating layer 27, or may be connected to the first transparent wiring 540 through a fifth vias K5 formed on the seventh insulating layer 27 and the sixth insulating layer 26. In this example, the first electrode 301 of the light-emitting element 30 in the second display region 200 may be connected to the pixel drive circuit disposed in the first display region 100 through at least one first transparent wiring 540 or at least one second transparent wiring 550. However, this embodiment is not limited thereto.

In this exemplary embodiment, as shown in FIG. 17, a plurality of first transparent wirings 540 have a wave shape in a plane parallel to the display substrate. The plurality of second transparent wirings 550 have a wave shape, and orthographic projections of the plurality of first transparent wirings 540 on the base substrate 10 are staggered with orthographic projections of the plurality of second transparent wirings 550 on the base substrate 10. The wave shape may have any curvature and radian, which is not limited by this embodiment. In some examples, the first transparent wiring layer 54 and the second transparent wiring layer 55 may be made of transparent conductive materials such as ITO.

In this exemplary embodiment, as shown in FIG. 16, the first electrode 301 of the light-emitting element 30 in the first display region 100 may be connected to a drain electrode of a first thin film transistor 101 of the pixel drive circuit through a via penetrating through the seventh insulating layer 27, the sixth insulating layer 26, and the fifth insulating layer 25. However, this embodiment is not limited thereto. For example, the first display region may be provided with a connection electrode, which is located on a side of the first electrode close to the base substrate and on a side of the pixel drive circuit away from the base substrate, and the first electrode may be electrically connected with a corresponding pixel drive circuit through the connection electrode.

In this exemplary embodiment, the transparent wiring connecting the first electrode and the pixel drive circuit is set as a double-layer and wave-shaped wiring whose orthographic projections are staggered, so that diffraction in the second display region may be reduced, thereby improving the problem with glare.

As to the description of other structures of the display region of this embodiment, reference may be made to the description of the previous embodiment, which hence will not be repeated here.

The structure (or method) shown in the present embodiment may be appropriately combined with the structure (or method) shown in other embodiments.

Figure 18:
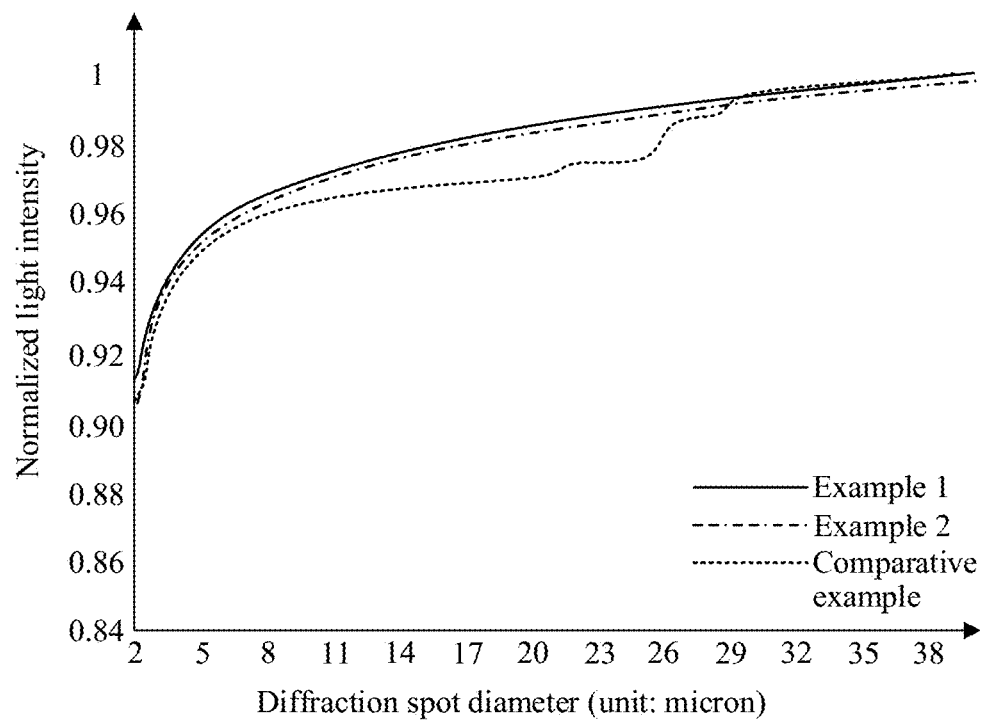
FIG. 18 is a schematic diagram of a simulation result of encircled diffraction energy of a display substrate according to at least one embodiment of the present disclosure.

FIG. 18 is a schematic diagram of a simulation result of encircled diffraction energy of a display substrate according to at least one embodiment of the present disclosure. In FIG. 18, the display substrate provided by a comparative example is provided with a single transparent wiring layer, and the transparent wiring layer includes a plurality of straight transparent wirings extending in a same direction. Example 1 is the embodiment shown in FIG. 15, and example 2 is the embodiment shown in FIG. 17. It may be seen from FIG. 18 that the display substrate provided in Example 2 has a higher light intensity ratio in the same spot diameter range than in Example 1. Moreover, the display substrates provided in Example 1 and Example 2 have a higher light intensity ratio in the same spot diameter range than the comparative example. It may be seen that the display substrate provided in this embodiment can reduce diffraction in the second display region, thereby improving the problem with glare.

Figure 19:
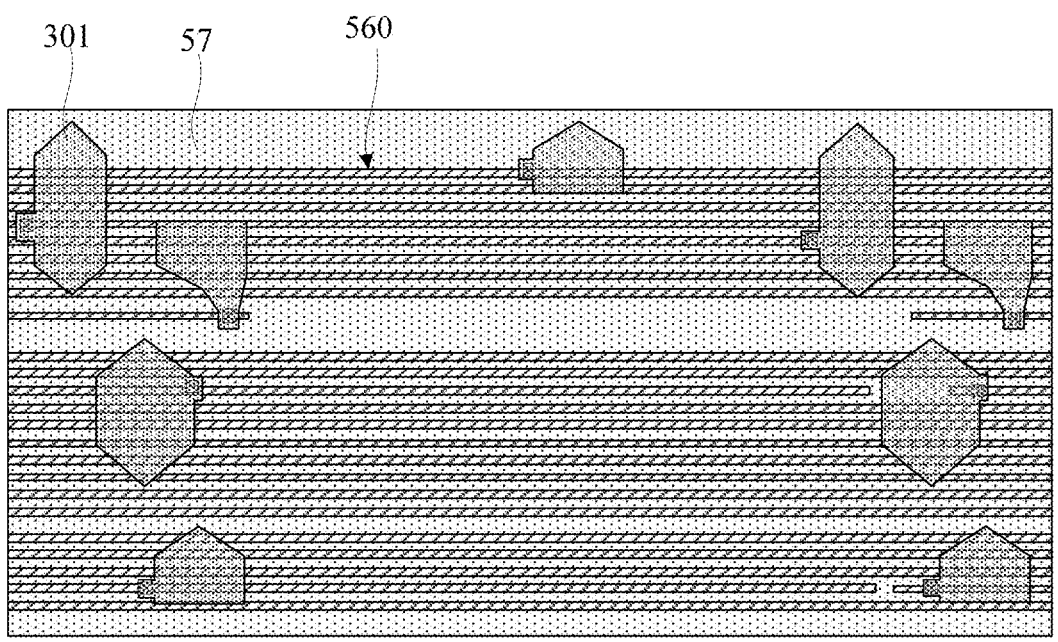
FIG. 19 is a schematic partial top view of a second display region according to at least one embodiment of the present disclosure.
Figure 20:
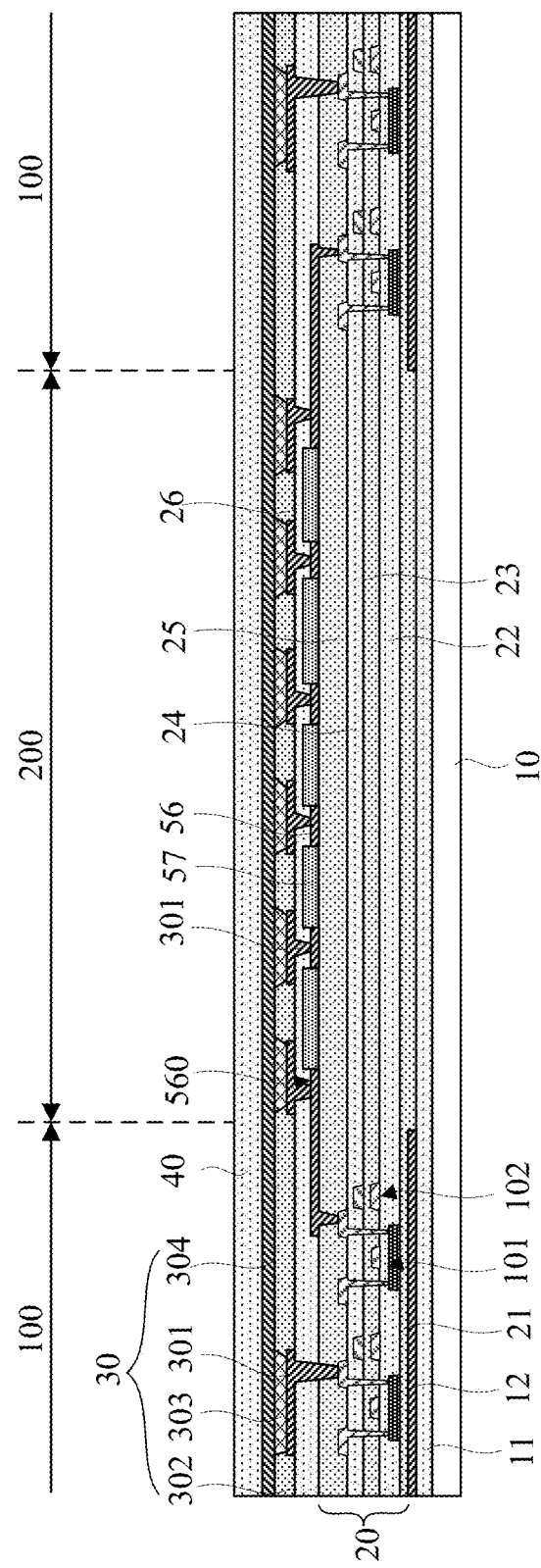
FIG. 20 is another schematic sectional view of a display substrate according to at least one embodiment of the present disclosure.

FIG. 19 is a schematic partial top view of a second display region of a display substrate according to at least one embodiment of the present disclosure. FIG. 20 is another schematic sectional view of a display substrate according to at least one embodiment of the present disclosure. As shown in FIG. 19 and FIG. 20, in some exemplary embodiments, in a plane perpendicular to the display substrate, a second display region 200 includes a base substrate 10, and a barrier layer 11, a plurality of insulating layers, a light adjustment layer, a light-emitting element 30 and an encapsulation layer 40 disposed on the base substrate 10. The light adjustment layer of the second display region 200 includes a third transparent wiring layer 56 and a third adjustment layer 57 sequentially disposed on the base substrate 10. The third transparent wiring layer 56 includes a plurality of third transparent wirings 560 extending in a same direction. The third adjustment layer 57 is located at a gap between the plurality of first transparent wirings 560. In some examples, an orthographic projection of the third adjustment layer 57 on the base substrate 10 does not overlap with the third transparent wiring layer 56. However, this embodiment is not limited thereto.

In some exemplary embodiments, as shown in FIG. 19, the plurality of third transparent wirings 560 are straight lines. The third transparent wiring layer 56 may be made of transparent conductive materials such as ITO. However, this embodiment is not limited thereto. In some examples, the third transparent wirings may have a wave shape.

In some exemplary embodiments, in the preparation process of the display substrate, after the third transparent wiring layer 56 is formed on the fifth insulating layer 25, a third adjustment layer 57 may be formed first, then the sixth insulating layer 26 is formed, and then the first electrode 301 is formed on the sixth insulating layer 26. The fifth insulating layer 25 and the sixth insulating layer 26 may be organic insulating layers.

In some exemplary embodiments, a material of the third adjustment layer is an inorganic material, such as SiOx. Taking the third transparent wiring layer made of ITO as an example, the refractive index $n_1$ of SiOx is about 1.473 and the extinction coefficient is about 0.0001. The refractive index $n_2$ of ITO (for example, with a thickness of 30 nm) is about 2.001, and the extinction coefficient is about 0.0031. The refractive index $n_3$ of the organic insulating layer is about 1.658 and the extinction coefficient is about 0.002. In order to make an optical path difference at an interface between ITO and the third adjustment layer to be equal to one-half wavelength for a complete interference cancellation, thickness d of the third adjustment layer should satisfy the following formula: $n_2*30+n_3*(d-30)-n_1*d=550/2$ (calculated by the wavelength of 550 nm which is the most sensitive to human eyes), and d=1430.9 nm, i.e. 1.43 um calculated by substituting relevant values. In some examples, the thickness of the third adjustment layer may be set to be about 1.4 um to 1.5 um, that is, interference cancellation may be achieved to a greater extent, and diffraction can be reduced.

In some exemplary embodiments, a material of the third regulating layer may be an organic material. Taking the third transparent wiring layer made of ITO as an example, the refractive index $n_1$ of the organic material of the third adjustment layer is about 1.489 and the extinction coefficient is about 0.0001. The refractive index $n_2$ of ITO (for example, with a thickness of 30 nm) is about 2.001, and the extinction coefficient is about 0.0031. The refractive index $n_3$ of the organic insulating layer is about 1.658 and the extinction coefficient is about 0.002. In order to make the optical path difference at the interface between ITO and the third adjustment layer to be equal to one-half wavelength for a complete interference cancellation, the thickness d of the third adjustment layer should satisfy the following formula: $n_2*30+n_3*(d-30)-n_1*d=550/2$ (calculated by the wavelength of 550 nm which is the most sensitive to human eyes), and d=1566.3 nm, i.e. 1.57 μm calculated by substituting relevant values. In some examples, the thickness of the third adjustment layer may be set to be about 1.5 um to 1.6 um, that is, interference cancellation may be achieved to a greater extent, and diffraction can be reduced.

In this exemplary embodiment, a third adjustment layer is disposed in the gap of the transparent wirings, so that the diffraction of the transparent wirings may be reduced by using the interference cancellation principle, thereby improving the problem with glare.

As to the description of other structures of the display region of this embodiment, reference may be made to the description of the previous embodiment, which hence will not be repeated here.

The structure (or method) shown in the present embodiment may be appropriately combined with the structure (or method) shown in other embodiments.

Figure 21:
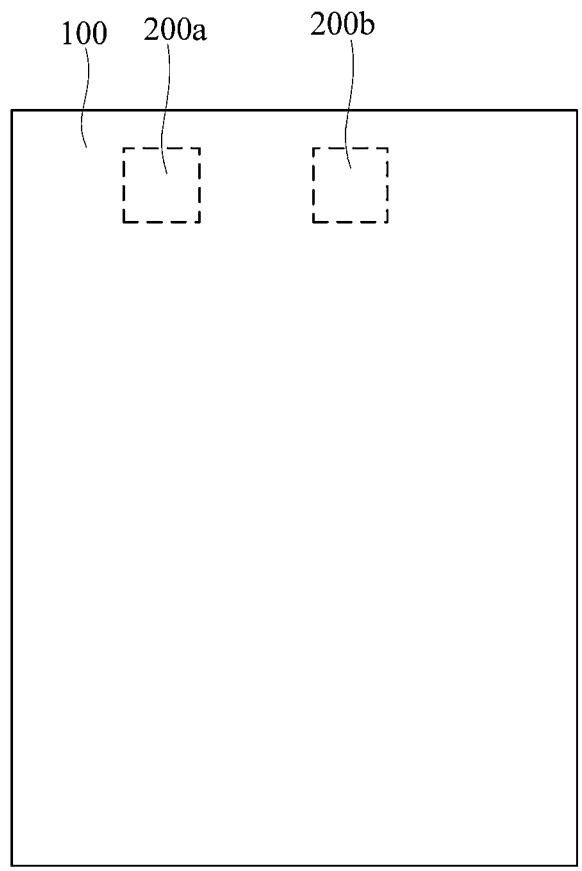
FIG. 21 is another schematic plan view of a display region of a display substrate according to at least one embodiment of the present disclosure.

FIG. 21 is another schematic diagram of a display substrate according to at least one embodiment of the present disclosure. In some exemplary embodiments, as shown in FIG. 21, the display substrate includes a first display region 100 and two mutually isolated second display regions (for example, second display regions 200a and 200b). For example, the second display regions 200a and 200b are both located in an upper half of the first display region 100. However, the locations of the two second display regions are not limited in this embodiment.

In some exemplary embodiments, a TOF element may be disposed at a side away from the light-emitting of the second display region 200a, and a camera may be disposed at a side away from the light-emitting surface of the second display region 200b. The structure of the second display region 200a may be referred to FIG. 2, and the structure of the second display region 200b may be referred to FIG. 17. However, this embodiment is not limited thereto.

For structure of the display region of the present embodiment, reference may be made to the description of the above embodiment, so it will not be repeated here.

The structure (or method) shown in the present embodiment may be appropriately combined with the structure (or method) shown in other embodiments.

Figure 22:
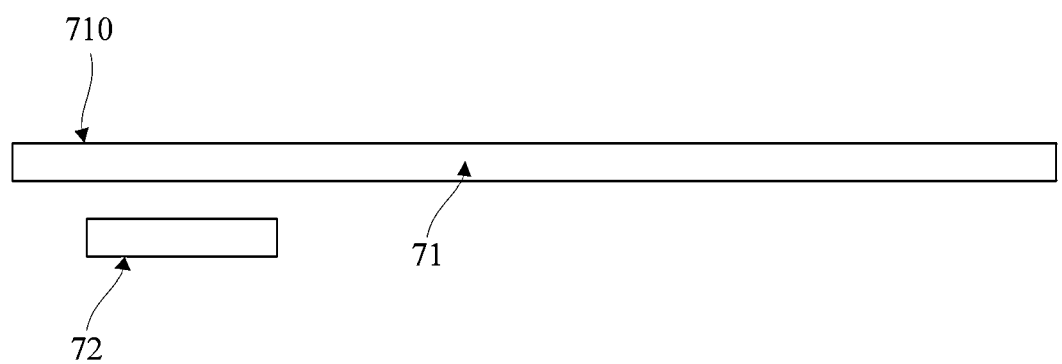
FIG. 22 is a schematic diagram of a display apparatus according to at least one embodiment of the present disclosure.

FIG. 22 is a schematic diagram of a display apparatus according to at least one embodiment of the present disclosure. In some exemplary embodiments, as shown in FIG. 22, the display apparatus may include a display substrate 71, and an optical device 72 located at a side away from a light-emitting surface 710 of the display substrate 71, wherein an orthographic projection of the optical device 72 on the display substrate 71 overlaps with a second display region of the display substrate. For example, the orthographic projection of the optical device 72 on the display substrate 71 is located in the second display region.

For the structure of the display substrate of the present embodiment, reference may be made to the description of the above embodiment, so it will not be repeated here.

The drawings in the present disclosure only refer to the structures involved in the present disclosure, and common designs may be referred to for other structures. The embodiments of the present disclosure and the features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

I claim:

1. A display substrate, comprising: a first display region and at least one second display region, wherein light transmittance of the at least one second display region is greater than light transmittance of the first display region; and the at least one second display region of the display substrate is provided with a light adjustment layer configured to adjust a light transmission effect of the at least one second display region, wherein the at least one second display region comprises a first sub-display region and a second sub-display region;

when a TOF element comprising an emitting sensor and a receiving sensor is disposed at a side away from a light-emitting surface of the display substrate, an orthographic projection of the emitting sensor on the display substrate is located in the first sub-display region, and an orthographic projection of the receiving sensor on the display substrate is located in the second sub-display region;

the light adjustment layer is disposed in the first sub-display region, and a surface of the light adjustment layer close to the light-emitting surface of the display substrate is convex.

2. The display substrate according to claim 1, wherein the first sub-display region of the display substrate comprises a base substrate and a light-emitting element disposed on the base substrate, and the light adjustment layer is located on a side of the light-emitting element close to the base substrate.

3. The display substrate according to claim 2, wherein the light-emitting element comprises a first electrode, a second electrode and an organic functional layer disposed between the first electrode and the second electrode; the first electrode is located on a side of the second electrode close to the base substrate; and an orthographic projection of the first electrode on the base substrate comprises an orthographic projection of the light adjustment layer on the base substrate.

4. The display substrate according to claim 1, wherein the light adjustment layer comprises a first adjustment layer and a light reflection layer sequentially disposed on the base substrate; and an orthographic projection of the light reflection layer on the base substrate comprises an orthographic projection of the first adjustment layer on the base substrate.

5. The display substrate according to claim 4, wherein the first adjustment layer comprises a plurality of first adjustment blocks; the light reflection layer comprises a plurality of light reflection blocks which are in one-to-one correspondence with the plurality of first adjustment blocks; and in a plane perpendicular to the display substrate, a cross section of the first adjustment block has a shape in which a first length is gradually reduced in a direction away from a surface of the base substrate, and the first length is a length of the first adjustment block in a direction parallel to the surface of the base substrate.

6. The display substrate according to claim 5, wherein in the plane perpendicular to the display substrate, the cross section of the first adjustment block is about a triangle or a semicircle.

7. The display substrate according to claim 4, wherein a material of the first adjustment layer is an organic material.

8. The display substrate according to claim 4, wherein the first display region of the display substrate comprises a base substrate, and a light shielding layer, a drive structure layer and a light-emitting element which are sequentially disposed on the base substrate; and the light reflection layer and the light shielding layer are disposed at a same layer.

9. The display substrate according to claim 1, further comprising: a base substrate and a plurality of pixel units disposed on the base substrate; at least one pixel unit of the plurality of pixel units comprises a plurality of sub-pixels, and at least one sub-pixel of the plurality of sub-pixels comprises a light-emitting element and a pixel drive circuit for driving the light-emitting element to emit light; the light-emitting element comprises a first electrode, a second electrode and an organic functional layer disposed between the first electrode and the second electrode, wherein the first electrode is located on a side of the second electrode close to the base substrate; and the light adjustment layer comprises a second adjustment layer, which is located on a side of the second electrode away from a light-emitting surface of the display substrate.

10. The display substrate according to claim 9, wherein the second adjustment layer comprises a plurality of second adjustment blocks; an orthographic projection of at least one second adjustment block on the base substrate is located between orthographic projections of first electrodes of adjacent pixel units on the base substrate, and an area of an orthographic projection of the at least one second adjustment block between the first electrodes of the adjacent pixel units is about half of an area of an orthographic projection of a second electrode between the first electrodes of the adjacent pixel units.

11. The display substrate according to claim 10, wherein there is an orthographic projection of a second adjustment block on the base substrate between the orthographic projections of the first electrodes of the adjacent pixel units on the base substrate, and the orthographic projection of the second adjustment block on the base substrate is located in the middle of the first electrodes of the adjacent pixel units or close to a first electrode of one of the adjacent pixel units; or, there are orthographic projections of two second adjustment blocks on the base substrate between the orthographic projections of the first electrodes of the adjacent pixel units on the base substrate, and the orthographic projections of the two second adjustment blocks on the base substrate are respectively adjacent to a first electrode of one of the adjacent pixel units.

12. The display substrate according to claim 9, wherein a material of the second adjustment layer is an inorganic material.

13. The display substrate according to claim 12, wherein a thickness of the second adjustment layer is about 1.8 microns to 3.8 microns.

14. The display substrate according to claim 1, wherein the first display region comprises a base substrate, a display structure layer and a light-emitting element sequentially disposed on the base substrate; the at least one second display region comprises a base substrate and a light-emitting element disposed on the base substrate;

the light-emitting element comprises a first electrode, a second electrode and an organic functional layer disposed between the first electrode and the second electrode, and the first electrode is located on a side of the second electrode close to the base substrate; and the light adjustment layer is located on a side of the first electrode close to the base substrate, and the first electrode is electrically connected with the display structure layer of the first display region through the light adjustment layer.

15. The display substrate according to claim 14, wherein the light adjustment layer comprises at least one transparent wiring layer comprising a plurality of transparent wirings extending in a same direction; and at least one transparent wiring has a wave shape.

16. The display substrate according to claim 15, wherein the light adjustment layer comprises a first transparent wiring layer and a second transparent wiring layer which are stacked; the first transparent wiring layer comprises a plurality of first transparent wirings, and the second transparent wiring layer comprises a plurality of second transparent wirings, and the first transparent wirings and the second transparent wirings extend in a same direction; and orthographic projections of the plurality of first transparent wirings of the first transparent wiring layer on the base substrate are staggered with orthographic projections of the plurality of second transparent wirings of the second transparent wiring layer on the base substrate.

17. The display substrate according to claim 14, wherein the light adjustment layer comprises at least one transparent wiring layer and a third adjustment layer; the at least one transparent wiring layer comprises a plurality of transparent wirings extending in a same direction, and the third adjustment layer fills gaps of the plurality of transparent wirings.

18. The display substrate according to claim 17, wherein a thickness of the third adjustment layer is about 1.3 microns to 1.7 microns.

19. A display apparatus, comprising a display substrate and an optical device located at a side away from a light-emitting surface of the display substrate; wherein, the display substrate comprises a first display region and at least one second display region, wherein light transmittance of the at least one second display region is greater than light transmittance of the first display region; the at least one second display region of the display substrate is provided with a light adjustment layer configured to adjust a light transmission effect of the at least one second display region; and an orthographic projection of the optical device on the display substrate overlaps with the at least one second display region, wherein the at least one second display region comprises a first sub-display region and a second sub-display region;

when a TOF element comprising an emitting sensor and a receiving sensor is disposed at a side away from a light-emitting surface of the display substrate, an orthographic projection of the emitting sensor on the display substrate is located in the first sub-display region, and an orthographic projection of the receiving sensor on the display substrate is located in the second sub-display region;

the light adjustment layer is disposed in the first sub-display region, and a surface of the light adjustment layer close to the light-emitting surface of the display substrate is convex.

* * * * *